(12) United States Patent
Glass et al.

(10) Patent No.: US 12,484,266 B2
(45) Date of Patent: Nov. 25, 2025

(54) GATE-ALL-AROUND INTEGRATED CIRCUIT STRUCTURES HAVING UNDERLYING DOPANT-DIFFUSION BLOCKING LAYERS

(71) Applicant: Intel Corporation, Santa Clara, CA (US)

(72) Inventors: Glenn Glass, Portland, OR (US);
Anand Murthy, Portland, OR (US);
Biswajeet Guha, Hillsboro, OR (US);
Dax Crum, Beaverton, OR (US);
Patrick Keys, Portland, OR (US);
Tahir Ghani, Portland, OR (US);
Susmita Ghose, Hillsboro, OR (US);
Ted Cook, Jr., Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 600 days.

(21) Appl. No.: 17/903,914

(22) Filed: Sep. 6, 2022

(65) Prior Publication Data
US 2022/0416024 A1    Dec. 29, 2022

Related U.S. Application Data

(63) Continuation of application No. 16/146,785, filed on Sep. 28, 2018, now Pat. No. 11,469,299.

(51) Int. Cl.
*H10D 30/67* (2025.01)
*H01L 21/02* (2006.01)
(Continued)

(52) U.S. Cl.
CPC ..... *H10D 62/121* (2025.01); *H01L 21/02532* (2013.01); *H01L 21/02603* (2013.01);
(Continued)

(58) Field of Classification Search
CPC .. H10D 30/6735; H10D 30/501; H10D 30/47; H10D 30/43; H10D 30/40
See application file for complete search history.

(56) References Cited

U.S. PATENT DOCUMENTS 9,484,267 B1    11/2016   Cheng
2014/0262707 A1*  9/2014   Pawashe ............... H10D 62/121
                                                                200/181
(Continued)

FOREIGN PATENT DOCUMENTS

WO    WO 2018/063248    4/2018
WO    WO 2018/063300    4/2018

OTHER PUBLICATIONS

Search Report for European Patent Application No. 19183069.4, mailed Apr. 6, 2020, 10 pgs.
(Continued)

*Primary Examiner* — Christopher A Johnson
(74) *Attorney, Agent, or Firm* — Schwabe, Williamson & Wyatt P.C.

(57) ABSTRACT

Gate-all-around integrated circuit structures having underlying dopant-diffusion blocking layers are described. For example, an integrated circuit structure includes a vertical arrangement of horizontal nanowires above a fin. The fin includes a dopant diffusion blocking layer on a first semiconductor layer, and a second semiconductor layer on the dopant diffusion blocking layer. A gate stack is around the vertical arrangement of horizontal nanowires. A first epitaxial source or drain structure is at a first end of the vertical arrangement of horizontal nanowires. A second epitaxial source or drain structure is at a second end of the vertical arrangement of horizontal nanowires.

20 Claims, 14 Drawing Sheets

(51) Int. Cl.
    *H01L 21/265*     (2006.01)
    *H01L 21/306*     (2006.01)
    *H01L 21/308*     (2006.01)
    *H10D 30/01*     (2025.01)
    *H10D 30/62*     (2025.01)
    *H10D 62/10*     (2025.01)
    *H10D 62/13*     (2025.01)
    *H10D 62/17*     (2025.01)
    *H10D 62/822*     (2025.01)
    *H01L 21/027*     (2006.01)
    *H01L 21/3213*     (2006.01)
    *H01L 21/683*     (2006.01)
    *H10D 64/01*     (2025.01)
    *H10D 84/01*     (2025.01)
    *H10D 84/03*     (2025.01)
    *H10D 84/85*     (2025.01)

(52) U.S. Cl.
    CPC .. H01L 21/26513 (2013.01); H01L 21/30604 (2013.01); H01L 21/3081 (2013.01); H10D 30/024 (2025.01); H10D 30/62 (2025.01); H10D 30/6735 (2025.01); H10D 62/151 (2025.01); H10D 62/292 (2025.01); H10D 62/822 (2025.01); *H01L 21/0276* (2013.01); *H01L 21/30625* (2013.01); *H01L 21/32134* (2013.01); *H01L 21/32135* (2013.01); *H01L 21/6835* (2013.01); *H01L 2221/6835* (2013.01); *H01L 2221/68381* (2013.01); *H10D 64/017* (2025.01); *H10D 84/0193* (2025.01); *H10D 84/038* (2025.01); *H10D 84/853* (2025.01)

(56) References Cited

U.S. PATENT DOCUMENTS

| | | |
|---|---|---|
| 2016/0204260 A1 | 7/2016 | Ching |
| 2017/0025314 A1 | 1/2017 | Witters |
| 2017/0229555 A1* | 8/2017 | Balakrishnan .... H01L 21/02538 |
| 2018/0047832 A1 | 2/2018 | Tapily |
| 2018/0175167 A1 | 6/2018 | Reboh |
| 2019/0058051 A1* | 2/2019 | Kim .................... H10D 30/014 |
| 2019/0198658 A1 | 6/2019 | Mohapatra |
| 2020/0119167 A1* | 4/2020 | More ................ H10D 30/6744 |

OTHER PUBLICATIONS

Office Action for European Patent Application No. 19183069.4, mailed Dec. 1, 2021, 5 pgs.

* cited by examiner

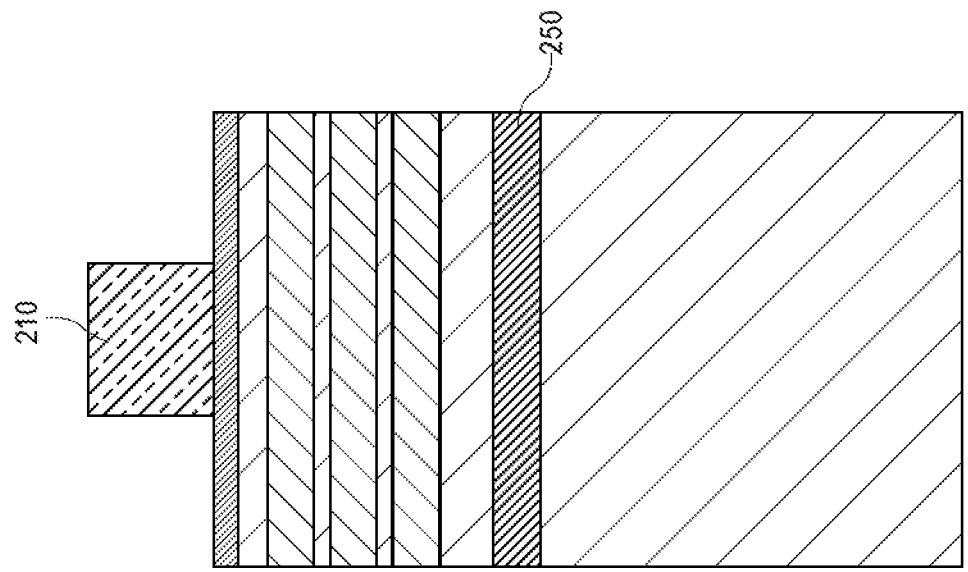
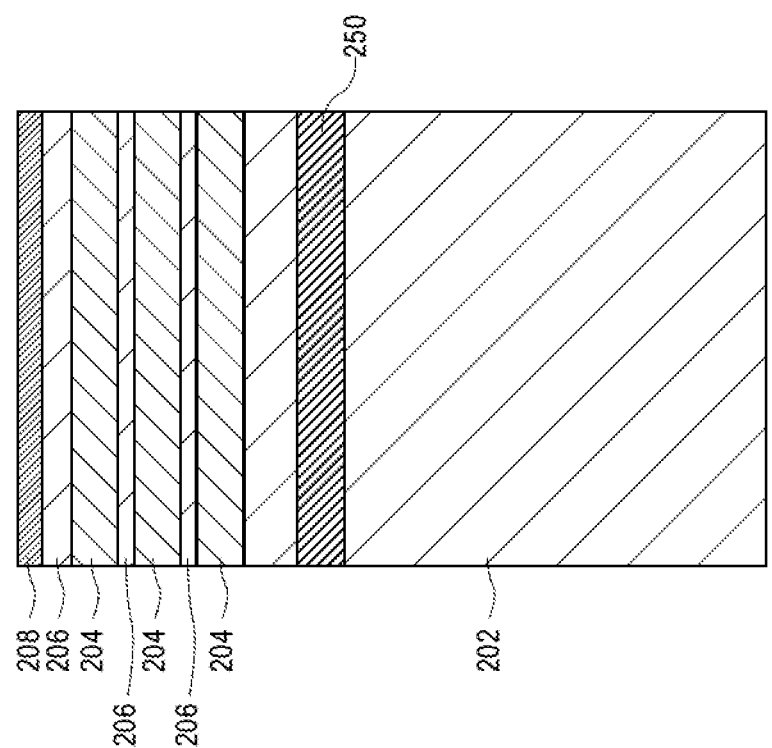
FIG. 2B
FIG. 2A

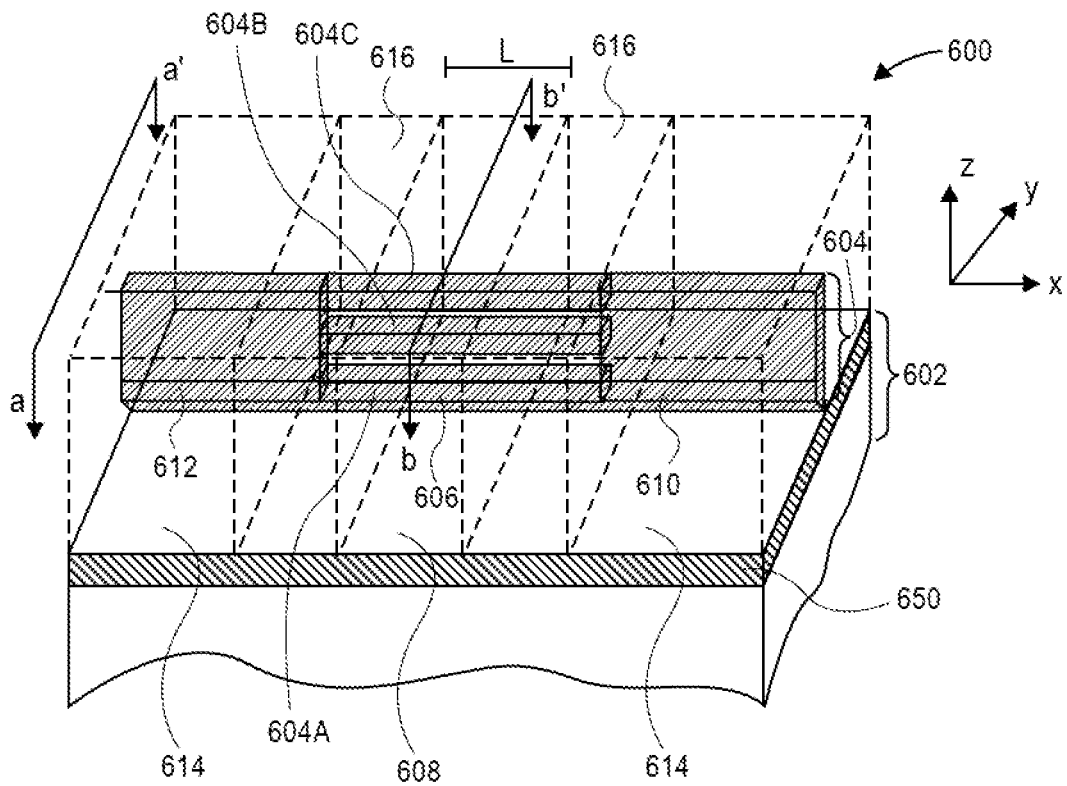
FIG. 6A
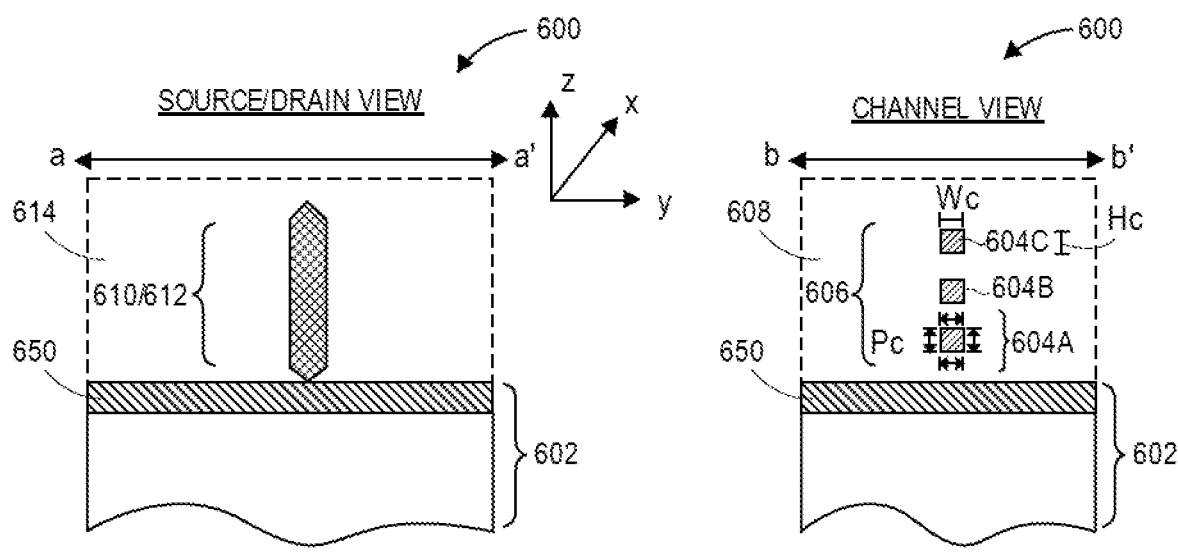
FIG. 6B　　　　　　　　FIG. 6C

GATE-ALL-AROUND INTEGRATED CIRCUIT STRUCTURES HAVING UNDERLYING DOPANT-DIFFUSION BLOCKING LAYERS

CROSS-REFERENCE TO RELATED APPLICATIONS

This application is a continuation of U.S. patent application Ser. No. 16/146,785, filed on Sep. 28, 2018, the entire contents of which is hereby incorporated by reference herein.

TECHNICAL FIELD

Embodiments of the disclosure are in the field of integrated circuit structures and processing and, in particular, gate-all-around integrated circuit structures having underlying dopant-diffusion blocking layers, and methods of fabricating gate-all-around integrated circuit structures having underlying dopant-diffusion blocking layers.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. In another aspect, maintaining mobility improvement and short channel control as microelectronic device dimensions scale below the 10 nanometer (nm) node provides a challenge in device fabrication. Nanowires used to fabricate devices provide improved short channel control.

Scaling multi-gate and nanowire transistors has not been without consequence, however. As the dimensions of these fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features.

Additionally, variability in conventional and currently known fabrication processes may limit the possibility to further extend them into the 10 nanometer node or sub-10 nanometer node range. Consequently, fabrication of the functional components needed for future technology nodes may require the introduction of new methodologies or the integration of new technologies in current fabrication processes or in place of current fabrication processes.

BRIEF DESCRIPTION OF THE DRAWINGS

FIGS. 2A-2H illustrates cross-sectional views of various operations in a method of fabricating a gate-all-around integrated circuit structure having an underlying dopant-diffusion blocking layer, in accordance with an embodiment of the present disclosure.

FIG. 6A illustrates a three-dimensional cross-sectional view of a nanowire-based integrated circuit structure, in accordance with an embodiment of the present disclosure.

FIG. 6B illustrates a cross-sectional source or drain view of the nanowire-based integrated circuit structure of FIG. 6A, as taken along the a-a' axis, in accordance with an embodiment of the present disclosure.

FIG. 6C illustrates a cross-sectional channel view of the nanowire-based integrated circuit structure of FIG. 6A, as taken along the b-b' axis, in accordance with an embodiment of the present disclosure.

DESCRIPTION OF THE EMBODIMENTS

Figure 1:
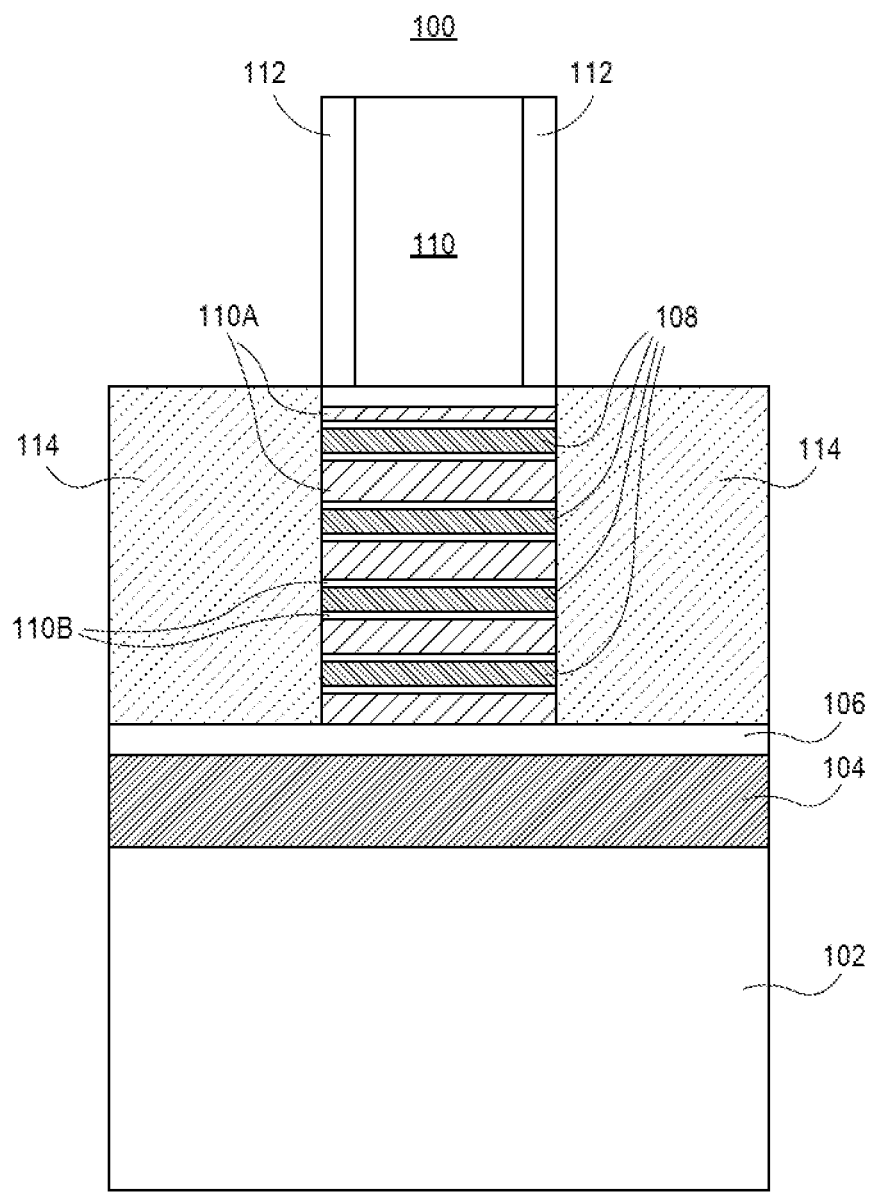
FIG. 1 illustrates a cross-sectional view of an integrated circuit structure having an underlying dopant-diffusion blocking layer, in accordance with an embodiment of the present disclosure.

Gate-all-around integrated circuit structures having underlying dopant-diffusion blocking layers, and methods of fabricating gate-all-around integrated circuit structures having underlying dopant-diffusion blocking layers, are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to sub-fin epitaxial dopant diffusion reduction layers for multiple nanowire transistors.

To provide context, a sub-fin region that is gated can exhibit behavior of a parasitic transistor with uncontrolled threshold voltage (VT). In order to shut off such a transistor, electrical isolation relies on the presence of a steep P-N junction, meaning that well doping is high, e.g., having a concentration of approximately 1E20 atoms/cm$^3$. Ideally, such doping should not diffuse into channel portions during multilayer epitaxial deposition of channel regions. Previous solutions to address such issues include the use of implanted carbon (and, possibly, fluorine) with silicon pre-amorphization. However, pre-amorphizing implants can result in high surface damage and surface contamination that detrimentally impact epitaxial growth quality in subsequent layer depositions. In another aspect, alternative material channel transistors (e.g., SiGe channel-based transistors) on silicon substrates and silicon channel transistors on alternative material buffer layers may exhibit enhanced leakage between source and drain in the region below an active gated transistor. Solutions used to solve such issues include the implementation of an oppositely doped layer below the active channel. A possible drawback to oppositely doping the layer below the active channel is that the dopants may diffuse into the active channel material during downstream processing.

In accordance with an embodiment of the present disclosure, addressing one or more of the above highlighted issues, an epitaxial layer of a carbon-containing material is deposited as a dopant diffusion blocking or reduction layer. Well patterning and implants are then performed. A multilayer epitaxial layer stack that provides the layers used for nanowires and intervening sacrificial material is then deposited, and may be retained beneath a channel region in a final structure to provide high performance nanowires/nanoribbons. In one embodiment, the dopant blocking layer is a carbon-doped silicon (Si:C) layer, a carbon-doped silicon germanium (SiGe:C) layer, or a carbon-doped germanium (Ge:C) layer. Placement of a heavily doped region (e.g., N-type dopants for a PMOS transistor or P-type dopants for an NMOS transistor) below the blocking layer can prevent enhanced leakage between source and drain in the region below the active gated transistor. The heavily doped region may be an ion-implanted region or a doped epitaxial growth region.

Advantages of implementing embodiments described herein may include enablement of scaling of gate-all-around technologies to future nodes, including those with alternative channel materials and/or the use of strained Si on alternative buffer materials by preventing source to drain leakage below a gated transistor and preventing unwanted diffusion of dopants from a sub-fin into the active channel. The resulting improvements may ultimately lead to improved transistor performance. Embodiments may be applicable to NMOS, PMOS, and CMOS transistors, alternative architectures such as TFETs and to a variety of channel materials. Approaches described herein may be used in a transistor fabrication scheme that utilizes epitaxial growth of a channel material and/or epitaxial growth of a buffer layer including strained and unstrained Si, strained and unstrained SiGe, Ge, and III-V channels.

In an embodiment, the dopant blocking layer and an overlying channel material deposited thereon can be grown as a blanket layer (as exemplified below) or in trenches (e.g., via an aspect ratio trapping (ART) processing scheme). An oppositely doped layer below the blocking layer can be either ion-implanted, epitaxially grown, or both. If epitaxially grown, the oppositely doped layer can be formed as a blanket layer or in trenches (e.g., via the ART scheme). If the oppositely doped layer is ion-implanted, the implantation may be performed before or after the growth of the blocking layer. Source or drain (S/D) fabrication may be either via etch and fill or through a raised S/D approach. In CMOS processing, the blocking layer can either be the same or different between NMOS and PMOS, whereas an underlying oppositely doped layer is different (oppositely doped) between NMOS and PMOS.

As an exemplary structure, FIG. 1 illustrates a cross-sectional view of an integrated circuit structure having an underlying dopant-diffusion blocking layer, in accordance with an embodiment of the present disclosure.

Referring to FIG. 1, an integrated circuit structure 100 includes a vertical arrangement of horizontal nanowires 108 above a fin. The fin includes a dopant diffusion blocking layer 104 (e.g., a carbon-containing layer) on a first semiconductor layer 102, and a second semiconductor layer 106 on the dopant diffusion blocking layer 104. In one embodiment, the first semiconductor layer 102 is doped to a first conductivity type. A gate stack 110 is around the vertical arrangement of horizontal nanowires. The gate stack 110 may include a gate electrode 110A and a gate dielectric 110B, and sidewall spacers 112 may be adjacent sidewalls of the gate stack 110. A first epitaxial source or drain structure (left 114) is at a first end of the vertical arrangement of horizontal nanowires 108. A second epitaxial source or drain structure (right 114) is at a second end of the vertical arrangement of horizontal nanowires 108. In one embodiment, the first and second epitaxial source or drain structures 114 are doped to a second conductivity type opposite the first conductivity type.

In an embodiment, the dopant diffusion blocking layer 104 includes carbon and silicon. In one such embodiment, the dopant diffusion blocking layer 104 further includes germanium. In an embodiment, the dopant diffusion blocking layer 104 includes a material selected from the group consisting of a carbon-doped silicon (Si:C) layer, a carbon-doped silicon germanium (SiGe:C) layer, and a carbon-doped germanium (Ge:C) layer.

In an embodiment, the fin includes a portion of a bulk silicon substrate, and the first semiconductor layer 102 is a region within the portion of the bulk silicon substrate. In an embodiment, the first conductivity type is N-type, and the second conductivity type is P-type. In an embodiment, the first conductivity type is P-type, and the second conductivity type is N-type. In an embodiment, the first and second semiconductor layers 102 and 106 are silicon layers.

In an embodiment, the first and second epitaxial source or drain structures 114 are on the second semiconductor layer 106, as is depicted. In another embodiment, not shown, the first and second epitaxial source or drain structures are on a recessed portion of the second semiconductor layer 106. In another embodiment, not shown, the first and second epitaxial source or drain structures 114 are on a portion of the dopant diffusion blocking layer 104.

In an embodiment, the first and second epitaxial source or drain structures 114 are non-discrete first and second epitaxial source or drain structures, as depicted in FIG. 1, and as described in greater detail below. In an embodiment, the first and second epitaxial source or drain structures 114 are discrete first and second epitaxial source or drain structures, as depicted in FIG. 2H, and as described in greater detail below.

In an embodiment, the vertical arrangement of horizontal nanowires 108 is a vertical arrangement of silicon nanowires, a vertical arrangement of silicon germanium nanowires, a vertical arrangement of germanium nanowires, or a vertical arrangement of Group III-V material nanowires. In an embodiment, the gate stack includes a high-k gate dielectric layer and a metal gate electrode.

As used throughout, unless specifically called out as a doped silicon layer, the term silicon, e.g., as used in silicon substrate or in silicon fin portion, may be used to describe a silicon material composed of a very substantial amount of, if not all, silicon. However, it is to be appreciated that, practically, 100% pure Si may be difficult to form and, hence, could include a tiny percentage of impurity dopants (such as boron, phosphorous or arsenic) and/or could include a tiny percentage of carbon or germanium. Such impurities may be included as an unavoidable impurity or component during deposition of Si or may "contaminate" the Si upon diffusion during post deposition processing.

As used throughout, unless specifically called out as a doped germanium layer, the term germanium, e.g., as used in germanium nucleation layer or germanium device layer or germanium channel structure, may be used to describe a germanium material composed of a very substantial amount of, if not all, germanium. However, it is to be appreciated that, practically, 100% pure Ge may be difficult to form and, hence, could include a tiny percentage of impurity dopants (such as boron, phosphorous or arsenic) and/or could include a tiny percentage of silicon or carbon. Such impurities may be included as an unavoidable impurity or component during deposition of Ge or may "contaminate" the Ge upon diffusion during post deposition processing. As such, embodiments described herein directed to a germanium nucleation layer or germanium device layer or germanium channel structure may include a germanium nucleation layer or germanium device layer or germanium channel structure that contains a relatively small amount, e.g., "impurity" level, non-Ge atoms or species, such as Si.

As used throughout, unless specifically called out as a doped silicon germanium layer, the term silicon germanium, e.g., as used in silicon germanium device layer or silicon germanium channel structure, may be used to describe a silicon germanium material composed of substantial portions of both silicon and germanium, such as at least 5% of both. In some embodiments, the amount of germanium is greater than the amount of silicon. In particular embodiments, a silicon germanium layer includes approximately 70% germanium and approximately 30% silicon ($Si_{30}Ge_{70}$). In other embodiments, the amount of silicon is greater than the amount of germanium. It is to be appreciated that, practically, 100% pure silicon germanium (referred to generally as SiGe) may be difficult to form and, hence, could include a tiny percentage of impurity dopants (such as boron, phosphorous or arsenic) and/or could include a tiny percentage of carbon. Such impurities may be included as an unavoidable impurity or component during deposition of SiGe or may "contaminate" the SiGe upon diffusion during post deposition processing. As such, embodiments described herein directed to a silicon germanium device layer or a silicon germanium channel structure may include a silicon germanium device layer or a silicon germanium channel structure that contains a relatively small amount, e.g., "impurity" level, non-Ge atoms or species.

As used throughout, unless specifically called out as a doped III-V material layer, the term III-V material or Group III-V material, e.g., as used in Group III-V material device layer or Group III-V material channel structure, may be used to describe a Group III-V material composed of a very substantial amount of, if not all, of the specified Group III-V material. It is to be appreciated that, practically, 100% pure Group III-V material may be difficult to form and, hence, could include a tiny percentage of impurity dopants (such as boron, phosphorous or arsenic) and/or could include a tiny percentage of carbon or tin or the like. Such impurities may be included as an unavoidable impurity or component during deposition of a Group III-V material or may "contaminate" the Group III-V material upon diffusion during post deposition processing. As such, embodiments described herein directed to a Group III-V material device layer or a Group III-V material channel structure may include a Group III-V material device layer or a Group III-V material channel structure that contains a relatively small amount, e.g., "impurity" level, other atoms or species. In an embodiment, a Group III-V material is a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof.

As an exemplary process flow, FIGS. 2A-2H illustrates cross-sectional views of various operations in a method of fabricating a gate-all-around integrated circuit structure having an underlying dopant-diffusion blocking layer, in accordance with an embodiment of the present disclosure.

Referring to FIG. 2A, a method of fabricating an integrated circuit structure includes forming a starting stack which includes alternating silicon germanium layers 204 and silicon layers 206 above a fin 202, such as a silicon fin. In an embodiment, the fin 202 includes a dopant diffusion blocking layer 250 (e.g., a carbon-containing layer) therein, examples of which are described above in association with FIG. 1. The silicon layers 206 may be referred to as a vertical arrangement of multiple horizontal silicon nanowires. A protective cap 208 may be formed above the alternating silicon germanium layer 204 and silicon layers 206, as is depicted.

Referring again to FIG. 2A, in an embodiment, the portion of fin 202 below the dopant diffusion blocking layer 250 is a well layer or is a sub-fin doped leakage blocking layer. Such a layer may be referred to as an oppositely doped layer, since it has a conductivity type opposite a conductivity type of a gate electrode and source of drain regions subsequently formed. In an embodiment, the dopant diffusion blocking layer 250 is an epitaxially grown layer. The portion of fin 202 below the dopant diffusion blocking layer 250 may be doped during its formation, or may be doped following fabrication of the dopant diffusion blocking layer 250, e.g., by implanting through the dopant diffusion blocking layer 250. In one such embodiment, the dopant diffusion blocking layer 250 ultimately includes dopants from the implant process. A lower channel material layer may then be formed on the dopant diffusion blocking layer 250, as is depicted.

Figure 2C:
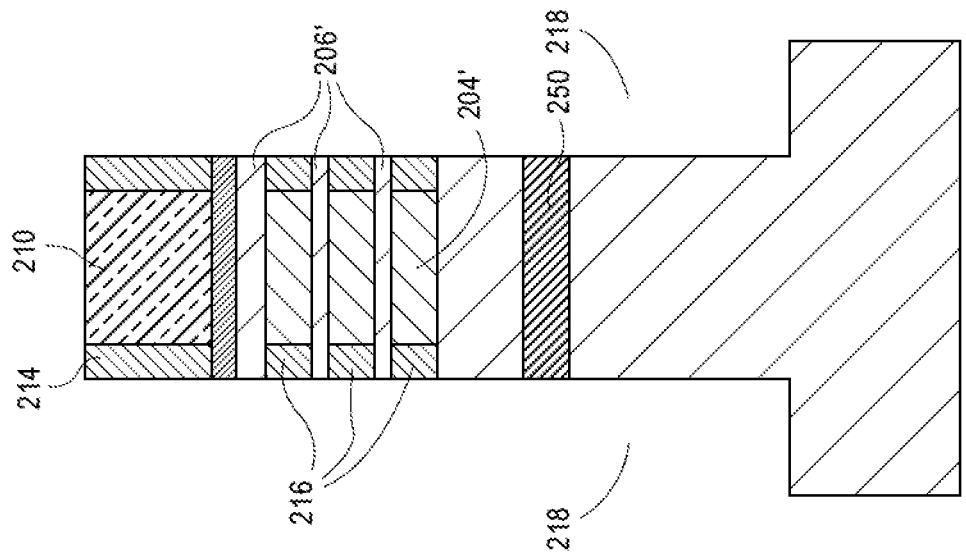

Referring to FIG. 2B, a gate stack 210 is formed over the vertical arrangement of horizontal nanowires 206. Portions of the vertical arrangement of horizontal nanowires 206 are then released by removing portions of the silicon germanium layer 204 to provide recessed silicon germanium layers 204' and cavities 212, as is depicted in FIG. 2C. It is to be appreciates that etching of the cavity 218 may actually be performed in the FIG. 2B location rather than after the sacrificial layer is removed.

Figure 2D:
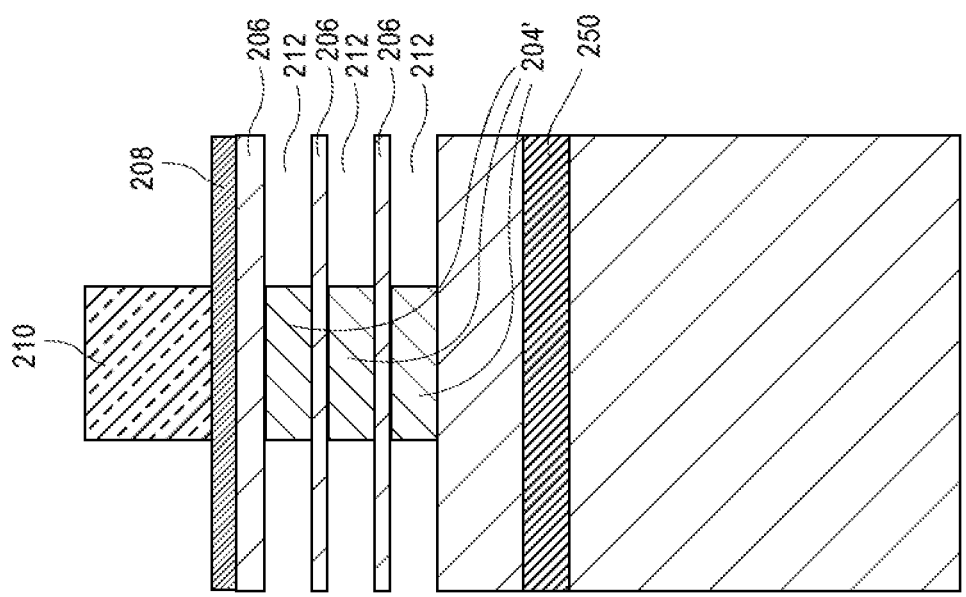
Figure 2F:
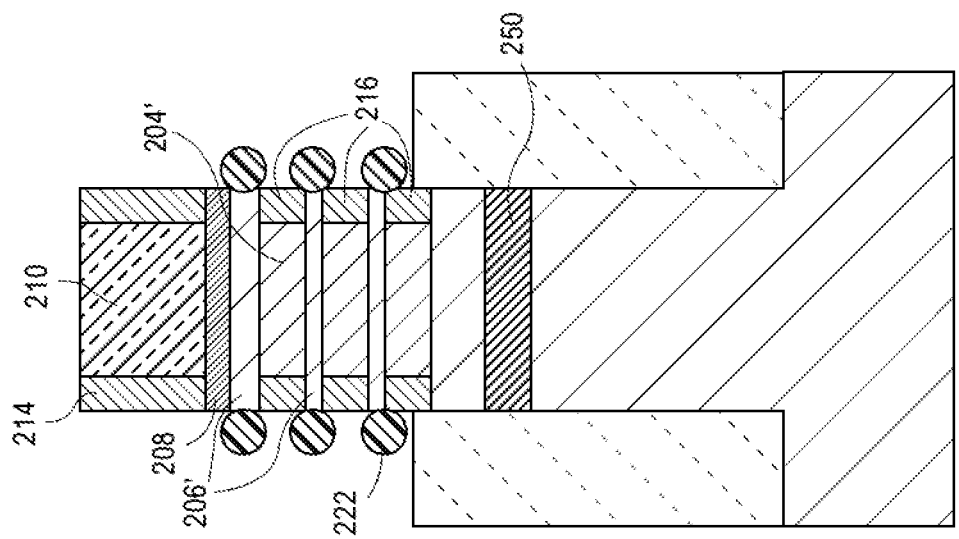

Referring to FIG. 2D, upper gate spacers 214 are formed at sidewalls of the gate structure 210. Cavity spacers 216 are formed in the cavities 212 beneath the upper gate spacers 214. An etch process may be used to form recessed nanowires 206'. The etch process may stop on or in the portion of the fin 202 below the dopant diffusion blocking layer 250, or may be extended through the dopant diffusion blocking layer 250 as depicted. In the case of the latter, deeper, etch, the etch forms trenches 218 in addition to forming the recessed nanowires 206'.

Figure 2E:
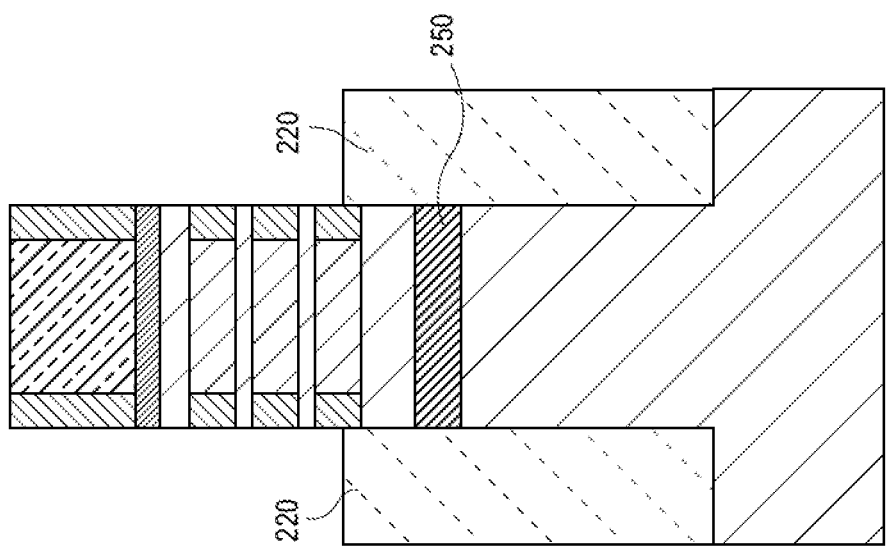

Referring to FIG. 2E, in an embodiment, an insulating material 220 is then formed in the trenches 218. In another embodiment, however, the etch performed at FIG. 2D is a relatively shallower etch that forms recessed nanowires 206' but does not form trenches 218. In the latter case, the insulating material 220 is reduced in relative thickness or not formed.

Referring to FIG. 2F, a first epitaxial source or drain structure (e.g., left-hand features 222) is formed at a first end of the vertical arrangement of horizontal nanowires 206'. A second epitaxial source or drain structure (e.g., right-hand features 222) is formed at a second end of the vertical arrangement of horizontal nanowires 206'. As shown, the first and second epitaxial source or drain structures 222 are discrete in that they are not vertically merged at the respective sides of the nanowires 206'. In other embodiments, the first and second epitaxial source or drain structures 222 are non-discrete in that they are vertically merged at the respective sides of the nanowires 206'. Such non-discrete structures may contact the insulating material 220 (in the case of a deep etch at FIG. 2D) or may contact an upper portion of fin 202 (in the case of a shallower etch at FIG. 2D).

Figure 2G:
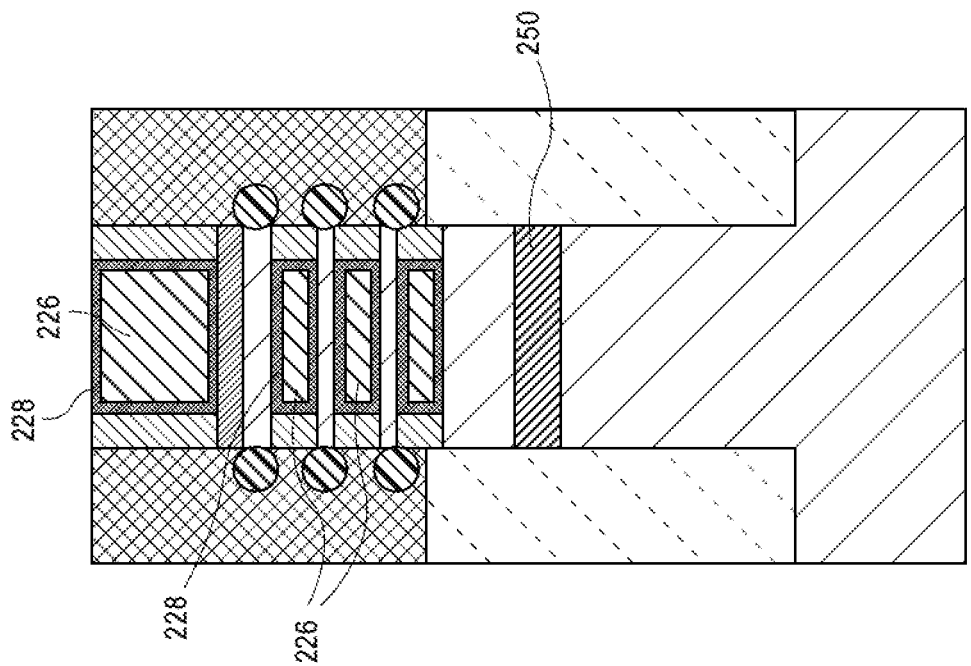
Figure 2H:
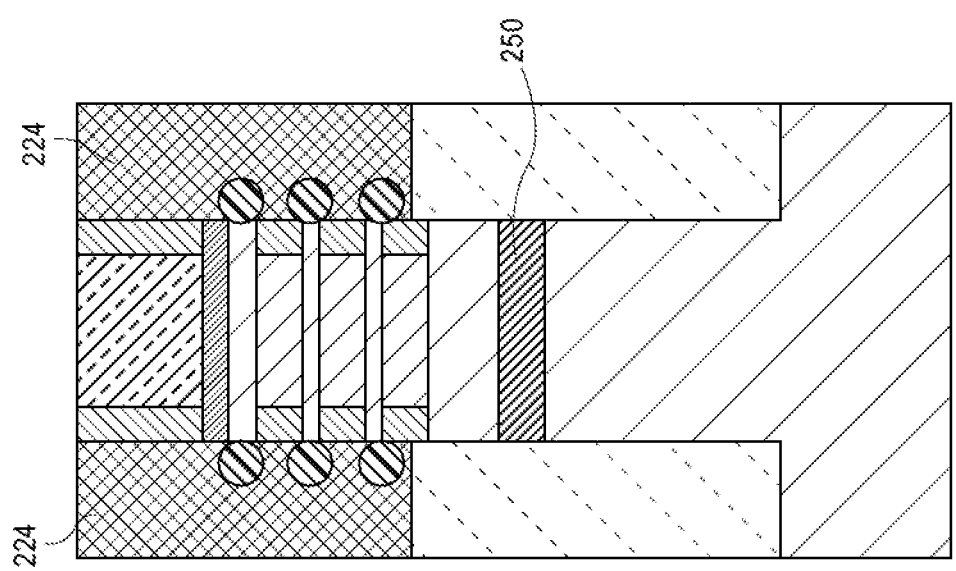

Referring to FIG. 2G, an inter-layer dielectric (ILD) material 224 is then formed at the sides of the gate electrode 210 and adjacent the source or drain structures 222. A replacement gate process is used to form a permanent gate dielectric 228 and a permanent gate electrode 226, as is depicted in FIG. 2H. Although not depicted, the ILD material 224 may then be removed for conductive contact formation in desired contact locations. Optionally and as desired, contact to certain structures can be made to the backside through certain regions 220 as will be elaborated on below.

Integrated circuit structures described herein may be fabricated using a back-side reveal of front-side structures fabrication approach. In some exemplary embodiments, reveal of the back-side of a transistor or other device structure entails wafer-level back-side processing. In contrast to a conventional TSV-type technology, a reveal of the back-side of a transistor as described herein may be performed at the density of the device cells, and even within sub-regions of a device. Furthermore, such a reveal of the back-side of a transistor may be performed to remove substantially all of a donor substrate upon which a device layer was disposed during front-side device processing. As such, a microns-deep TSV becomes unnecessary with the thickness of semiconductor in the device cells following a reveal of the back-side of a transistor potentially being only tens or hundreds of nanometers.

Reveal techniques described herein may enable a paradigm shift from "bottom-up" device fabrication to "center-out" fabrication, where the "center" is any layer that is employed in front-side fabrication, revealed from the back side, and again employed in back-side fabrication. Processing of both a front side and revealed back side of a device structure may address many of the challenges associated with fabricating 3D ICs when primarily relying on front-side processing.

A reveal of the back-side of a transistor approach may be employed for example to remove at least a portion of a carrier layer and intervening layer of a donor-host substrate assembly. The process flow begins with an input of a donor-host substrate assembly. A thickness of a carrier layer in the donor-host substrate is polished (e.g., CMP) and/or etched with a wet or dry (e.g., plasma) etch process. Any grind, polish, and/or wet/dry etch process known to be suitable for the composition of the carrier layer may be employed. For example, where the carrier layer is a group IV semiconductor (e.g., silicon) a CMP slurry known to be suitable for thinning the semiconductor may be employed. Likewise, any wet etchant or plasma etch process known to be suitable for thinning the group IV semiconductor may also be employed.

In some embodiments, the above is preceded by cleaving the carrier layer along a fracture plane substantially parallel to the intervening layer. The cleaving or fracture process may be utilized to remove a substantial portion of the carrier layer as a bulk mass, reducing the polish or etch time needed to remove the carrier layer. For example, where a carrier layer is 400-900 µm in thickness, 100-700 µm may be cleaved off by practicing any blanket implant known to promote a wafer-level fracture. In some exemplary embodiments, a light element (e.g., H, He, or Li) is implanted to a uniform target depth within the carrier layer where the fracture plane is desired. Following such a cleaving process, the thickness of the carrier layer remaining in the donor-host substrate assembly may then be polished or etched to complete removal. Alternatively, where the carrier layer is not fractured, the grind, polish and/or etch operation may be employed to remove a greater thickness of the carrier layer.

Next, exposure of an intervening layer is detected. Detection is used to identify a point when the back-side surface of the donor substrate has advanced to nearly the device layer. Any endpoint detection technique known to be suitable for detecting a transition between the materials employed for the carrier layer and the intervening layer may be practiced. In some embodiments, one or more endpoint criteria are based on detecting a change in optical absorbance or emission of the back-side surface of the donor substrate during the polishing or etching performed. In some other embodiments, the endpoint criteria are associated with a change in optical absorbance or emission of byproducts during the polishing or etching of the donor substrate back-side surface. For example, absorbance or emission wavelengths associated with the carrier layer etch byproducts may change as a function of the different compositions of the carrier layer and intervening layer. In other embodiments, the endpoint criteria are associated with a change in mass of species in byproducts of polishing or etching the back-side surface of the donor substrate. For example, the byproducts of processing may be sampled through a quadrupole mass analyzer and a change in the species mass may be correlated to the different compositions of the carrier layer and intervening layer. In another exemplary embodiment, the endpoint criteria is associated with a change in friction between a back-side surface of the donor substrate and a polishing surface in contact with the back-side surface of the donor substrate.

Detection of the intervening layer may be enhanced where the removal process is selective to the carrier layer relative to the intervening layer as non-uniformity in the carrier removal process may be mitigated by an etch rate delta between the carrier layer and intervening layer. Detection may even be skipped if the grind, polish and/or etch operation removes the intervening layer at a rate sufficiently below the rate at which the carrier layer is removed. If an endpoint criteria is not employed, a grind, polish and/or etch operation of a predetermined fixed duration may stop on the intervening layer material if the thickness of the intervening layer is sufficient for the selectivity of the etch. In some examples, the carrier etch rate:intervening layer etch rate is 3:1-10:1, or more.

Upon exposing the intervening layer, at least a portion of the intervening layer may be removed. For example, one or more component layers of the intervening layer may be removed. A thickness of the intervening layer may be removed uniformly by a polish, for example. Alternatively, a thickness of the intervening layer may be removed with a masked or blanket etch process. The process may employ the same polish or etch process as that employed to thin the carrier, or may be a distinct process with distinct process parameters. For example, where the intervening layer provides an etch stop for the carrier removal process, the latter operation may employ a different polish or etch process that favors removal of the intervening layer over removal of the device layer. Where less than a few hundred nanometers of intervening layer thickness is to be removed, the removal process may be relatively slow, optimized for across-wafer uniformity, and more precisely controlled than that employed for removal of the carrier layer. A CHIP process employed may, for example employ a slurry that offers very high selectively (e.g., 100:1-300:1, or more) between semiconductor (e.g., silicon) and dielectric material (e.g., SiO) surrounding the device layer and embedded within the intervening layer, for example, as electrical isolation between adjacent device regions.

For embodiments where the device layer is revealed through complete removal of the intervening layer, backside processing may commence on an exposed backside of the device layer or specific device regions there in. In some embodiments, the backside device layer processing includes a further polish or wet/dry etch through a thickness of the device layer disposed between the intervening layer and a device region previously fabricated in the device layer, such as a source or drain region.

In some embodiments where the carrier layer, intervening layer, or device layer backside is recessed with a wet and/or plasma etch, such an etch may be a patterned etch or a materially selective etch that imparts significant non-planarity or topography into the device layer back-side surface. As described further below, the patterning may be within a device cell (i.e., "intra-cell patterning) or may be across device cells (i.e., "inter-cell patterning). In some patterned etch embodiments, at least a partial thickness of the intervening layer is employed as a hard mask for back-side device layer patterning. Hence, a masked etch process may preface a correspondingly masked device layer etch.

The above described processing scheme may result in a donor-host substrate assembly that includes IC devices that have a back side of an intervening layer, a back side of the device layer, and/or back side of one or more semiconductor regions within the device layer, and/or front-side metallization revealed. Additional backside processing of any of these revealed regions may then be performed during downstream processing.

It is to be appreciated that the structures resulting from the above exemplary processing schemes may be used in a same or similar form for subsequent processing operations to complete device fabrication, such as PMOS and/or NMOS device fabrication. As an example of a completed device, FIG. 3 illustrate a cross-sectional view of a non-planar integrated circuit structure as taken along a gate line, in accordance with an embodiment of the present disclosure.

Figure 3:
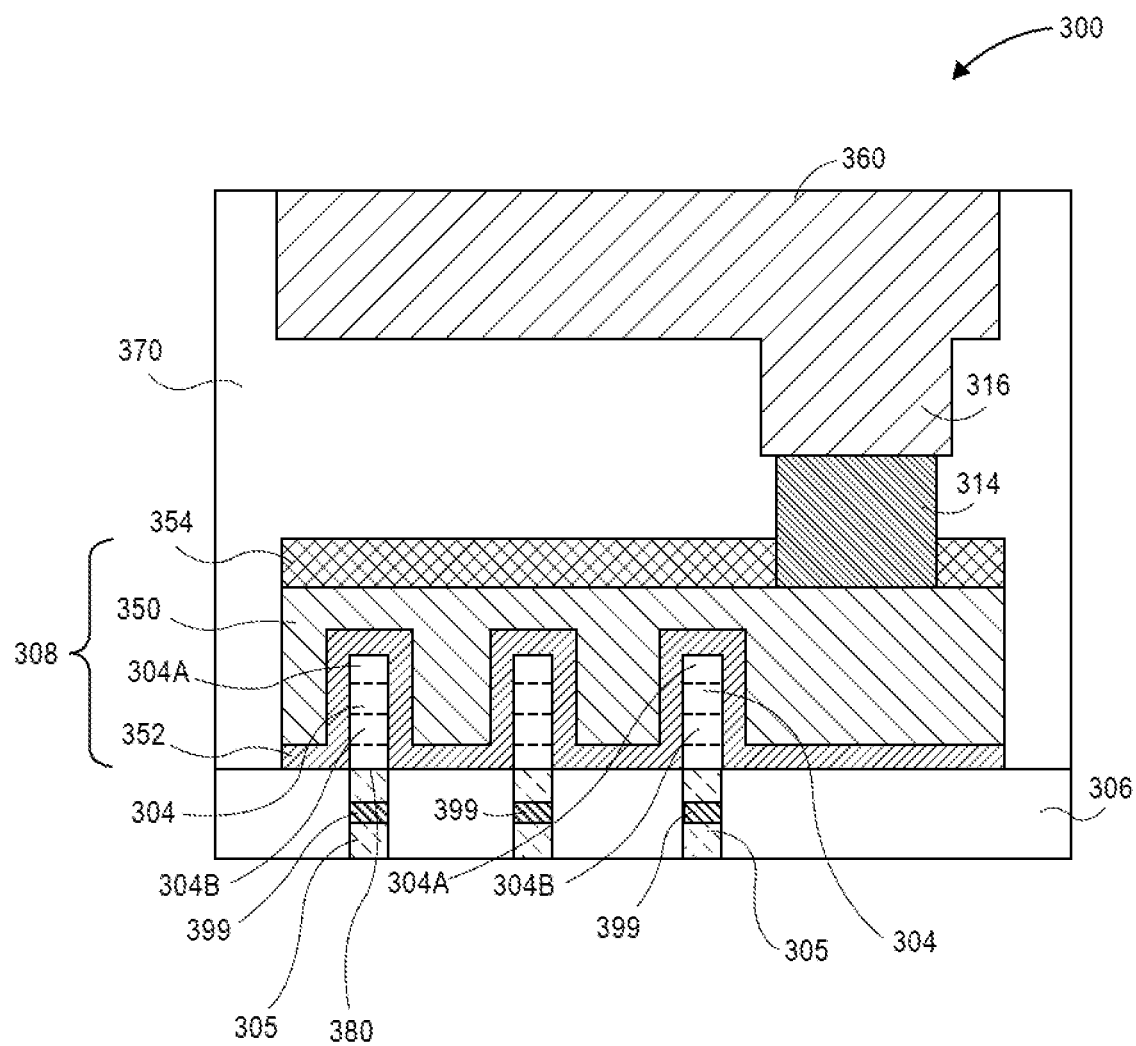
FIG. 3 illustrates a cross-sectional view of a non-planar integrated circuit structure as taken along a gate line, in accordance with an embodiment of the present disclosure.

Referring to FIG. 3, a semiconductor structure or device 300 includes a non-planar active region (e.g., a fin structure including protruding fin portion 304 and sub-fin region 305) within a trench isolation region 306. In an embodiment, instead of a solid fin, the non-planar active region is separated into nanowires (such as nanowires 304A and 304B) above sub-fin region 305, as is represented by the dashed lines. In either case, for ease of description for non-planar integrated circuit structure 300, a non-planar active region 304 is referenced below as a protruding fin portion. In an embodiment, as depicted, a dopant diffusion blocking layer 399 (e.g., a carbon-containing layer) is included in the sub-fin region 305, examples of which are described above in association with FIG. 1.

A gate line 308 is disposed over the protruding portions 304 of the non-planar active region (including, if applicable, surrounding nanowires 304A and 304B), as well as over a portion of the trench isolation region 306. As shown, gate line 308 includes a gate electrode 350 and a gate dielectric layer 352. In one embodiment, gate line 308 may also include a dielectric cap layer 354. A gate contact 314, and overlying gate contact via 316 are also seen from this perspective, along with an overlying metal interconnect 360, all of which are disposed in inter-layer dielectric stacks or layers 370. Also seen from the perspective of FIG. 3, the gate contact 314 is, in one embodiment, disposed over trench isolation region 306, but not over the non-planar active regions.

In an embodiment, the semiconductor structure or device 300 is a non-planar device such as, but not limited to, a fin-FET device, a tri-gate device, a nano-ribbon device, or a nano-wire device. In such an embodiment, a corresponding semiconducting channel region is composed of or is formed in a three-dimensional body. In one such embodiment, the gate electrode stacks of gate lines 308 surround at least a top surface and a pair of sidewalls of the three-dimensional body.

As is also depicted in FIG. 3, in an embodiment, an interface 380 exists between a protruding fin portion 304 and sub-fin region 305. The interface 380 can be a transition region between a doped sub-fin region 305 and a lightly or undoped upper fin portion 304. In one such embodiment, each fin is approximately 10 nanometers wide or less, and sub-fin dopants are supplied from an adjacent solid state doping layer at the sub-fin location. In a particular such embodiment, each fin is less than 10 nanometers wide.

Although not depicted in FIG. 3, it is to be appreciated that source or drain regions of or adjacent to the protruding fin portions 304 are on either side of the gate line 308, i.e., into and out of the page. In one embodiment, the source or drain regions are doped portions of original material of the protruding fin portions 304. In another embodiment, the material of the protruding fin portions 304 is removed and replaced with another semiconductor material, e.g., by epitaxial deposition to form discrete epitaxial nubs or non-discrete epitaxial structures. In either embodiment, the source or drain regions may extend below the height of dielectric layer of trench isolation region 306, i.e., into the sub-fin region 305. In accordance with an embodiment of the present disclosure, the more heavily doped sub-fin regions, i.e., the doped portions of the fins below interface 380, inhibits source to drain leakage through this portion of the bulk semiconductor fins.

With reference again to FIG. 3, in an embodiment, fins 304/305 (and, possibly nanowires 304A and 304B) are composed of a crystalline silicon, silicon/germanium or germanium layer doped with a charge carrier, such as but not limited to phosphorus, arsenic, boron or a combination thereof. In one embodiment, the concentration of silicon atoms is greater than 93%. In another embodiment, fins 304/305 are composed of a group III-V material, such as, but not limited to, gallium nitride, gallium phosphide, gallium arsenide, indium phosphide, indium antimonide, indium gallium arsenide, aluminum gallium arsenide, indium gallium phosphide, or a combination thereof. Trench isolation region 306 may be composed of a dielectric material such as, but not limited to, silicon dioxide, silicon oxy-nitride, silicon nitride, or carbon-doped silicon nitride.

Gate line 308 may be composed of a gate electrode stack which includes a gate dielectric layer 352 and a gate electrode layer 350. In an embodiment, the gate electrode of the gate electrode stack is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate fin 304. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In some implementations, a portion of the gate dielectric is a "U"-shaped structure that includes a bottom portion substantially parallel to the surface of the substrate and two sidewall portions that are substantially perpendicular to the top surface of the substrate.

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. The gate electrode layer may consist of a P-type workfunction metal or an N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

Spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Gate contact 314 and overlying gate contact via 316 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material).

In an embodiment (although not shown), a contact pattern which is essentially perfectly aligned to an existing gate pattern 308 is formed while eliminating the use of a lithographic step with exceedingly tight registration budget. In one such embodiment, the self-aligned approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

In an embodiment, providing structure 300 involves fabrication of the gate stack structure 308 by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

Referring again to FIG. 3, the arrangement of semiconductor structure or device 300 places the gate contact over isolation regions. Such an arrangement may be viewed as inefficient use of layout space. In another embodiment, however, a semiconductor device has contact structures that contact portions of a gate electrode formed over an active region, e.g., over a fin 305, and in a same layer as a trench contact via.

It is to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, or a FIN-FET. One or more embodiments may be particularly useful for fabricating semiconductor devices at a sub-10 nanometer (10 nm) technology node.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials, capping layers, or plugs are composed of dielectric materials different from the interlayer dielectric material. In one embodiment, different hardmask, capping or plug materials may be used in different regions so as to provide different growth or etch selectivity to each other and to the underlying dielectric and metal layers. In some embodiments, a hardmask layer, capping or plug layer includes a layer of a nitride of silicon (e.g., silicon nitride) or a layer of an oxide of silicon, or both, or a combination thereof. Other suitable materials may include carbon-based materials. Other hardmask, capping or plug layers known in the arts may be used depending upon the particular implementation. The hardmask, capping or plug layers may be formed by CVD, PVD, or by other deposition methods.

In an embodiment, as is also used throughout the present description, lithographic operations are performed using 193 nm immersion litho (i193), EUV and/or EBDW lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

In accordance with one or more embodiments of the present disclosure, a double-sided device processing scheme may be practiced at the wafer-level. In some exemplary embodiments, a large formal substrate (e.g., 300 or 450 mm diameter) wafer may be processed. In an exemplary processing scheme, a donor substrate including a device layer is provided. In some embodiments, the device layer is a semiconductor material that is employed by an IC device. As one example, in a transistor device, such as a field effect transistor (FET), the channel semiconductor is formed from the semiconductor device layer.

In another aspect, one or more embodiments are directed to neighboring semiconductor structures or devices separated by self-aligned gate endcap (SAGE) structures. Particular embodiments may be directed to integration of multiple width (multi-Wsi) nanowires and nanoribbons in a SAGE architecture and separated by a SAGE wall. In an embodiment, nanowires/nanoribbons are integrated with multiple Wsi in a SAGE architecture portion of a front end process flow. Such a process flow may involve integration of nanowires and nanoribbons of different Wsi to provide robust functionality of next generation transistors with low power and high performance. Associated epitaxial source or drain regions may be embedded (e.g., portions of nanowires removed and then source or drain (S/D) growth is performed) or formed by vertical merging (e.g., epitaxial regions are formed around existing wires), as described in greater detail below in association with FIGS. 7A-7E.

To provide further context, advantages of a self-aligned gate endcap (SAGE) architecture may include the enabling of higher layout density and, in particular, scaling of diffusion to diffusion spacing. To provide illustrative comparison, FIG. 4 illustrates cross-sectional views taken through nanowires and fins for a non-endcap architecture (left-hand side) versus a self-aligned gate endcap (SAGE) architecture (right-hand side), in accordance with an embodiment of the present disclosure.

Figure 4:
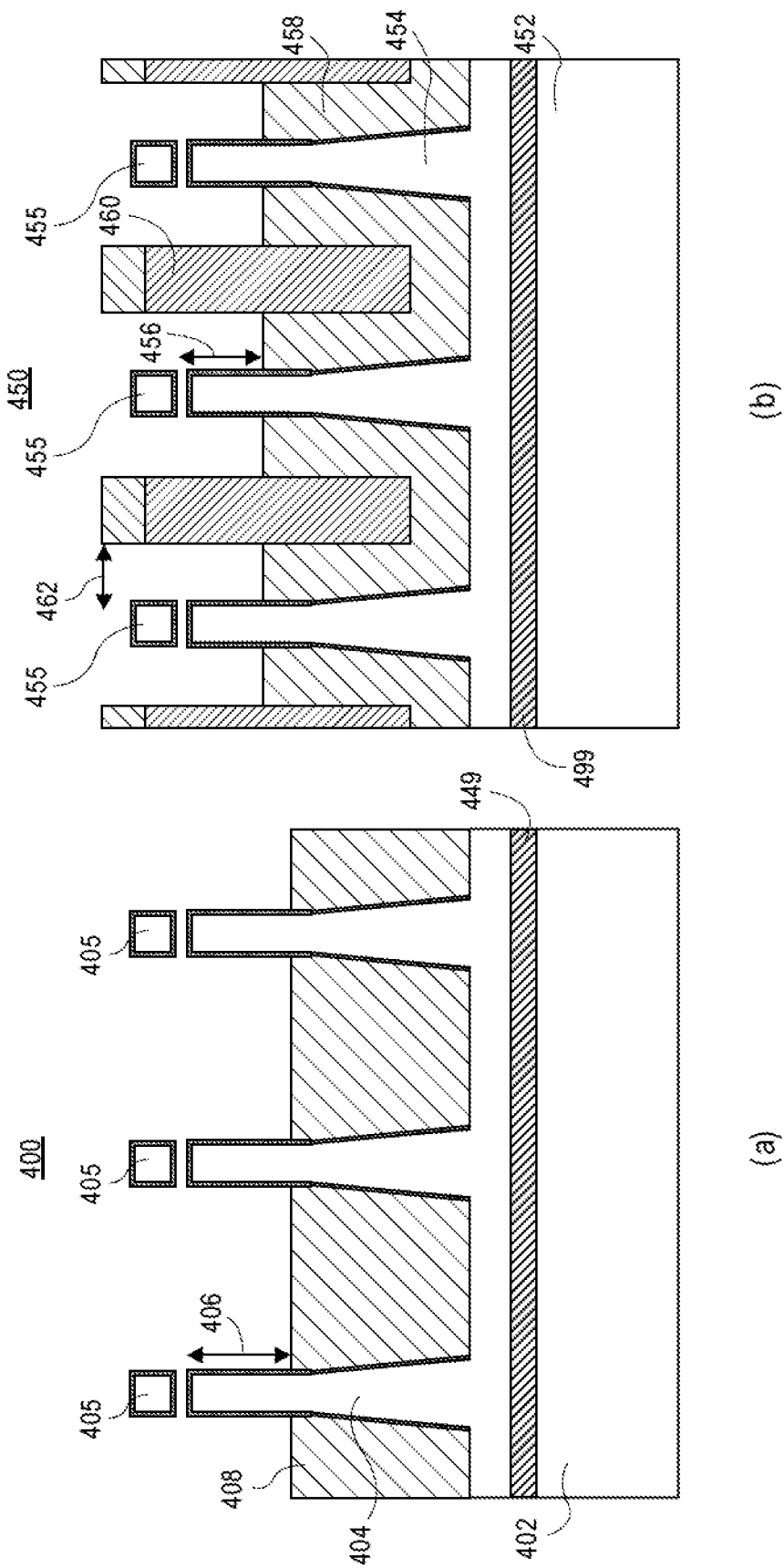
FIG. 4 illustrates cross-sectional views taken through nanowires and fins for a non-endcap architecture (left-hand side (a)) versus a self-aligned gate endcap (SAGE) architecture (right-hand side (b)), in accordance with an embodiment of the present disclosure.

Referring to the left-hand side (a) of FIG. 4, an integrated circuit structure 400 includes a substrate 402 having fins 404 protruding therefrom by an amount 406 above an isolation structure 408 laterally surrounding lower portions of the fins 404. Corresponding nanowires 405 are over the fins 404. A gate structure may be formed over the integrated circuit structure 400 to fabricate a device. However, breaks in such a gate structure may be accommodated for by increasing the spacing between fin 404/nanowire 405 pairs. In an embodiment, as depicted, a dopant diffusion blocking layer 449 (e.g., a carbon-containing layer) is included in the substrate 402 or, alternatively, in a sub-fin region of fins 404. Examples of such a dopant diffusion blocking layer are described above in association with FIG. 1.

By contrast, referring to the right-hand side (b) of FIG. 4, an integrated circuit structure 450 includes a substrate 452 having fins 454 protruding therefrom by an amount 456 above an isolation structure 458 laterally surrounding lower portions of the fins 404. Corresponding nanowires 405 are over the fins 404. Isolating SAGE walls 460 (which may include a hardmask thereon, as depicted) are included within the isolation structure 452 and between adjacent fin 454/nanowire 455 pairs. The distance between an isolating SAGE wall 460 and a nearest fin 454/nanowire 455 pair defines the gate endcap spacing 462. A gate structure may be formed over the integrated circuit structure 400, between insolating SAGE walls to fabricate a device. Breaks in such a gate structure are imposed by the isolating SAGE walls. Since the isolating SAGE walls 460 are self-aligned, restrictions from conventional approaches can be minimized to enable more aggressive diffusion to diffusion spacing. Furthermore, since gate structures include breaks at all locations, individual gate structure portions may be layer connected by local interconnects formed over the isolating SAGE walls 460. In an embodiment, as depicted, the SAGE walls 460 each include a lower dielectric portion and a dielectric cap on the lower dielectric portion. In an embodiment, as depicted, a dopant diffusion blocking layer 499 (e.g., a carbon-containing layer) is included in the substrate 452 or, alternatively, in a sub-fin region of fins 454. Examples of such a dopant diffusion blocking layer are described above in association with FIG. 1.

A self-aligned gate endcap (SAGE) processing scheme involves the formation of gate/trench contact endcaps self-aligned to fins without requiring an extra length to account for mask mis-registration. Thus, embodiments may be implemented to enable shrinking of transistor layout area. Embodiments described herein may involve the fabrication of gate endcap isolation structures, which may also be referred to as gate walls, isolation gate walls or self-aligned gate endcap (SAGE) walls.

Figure 5:
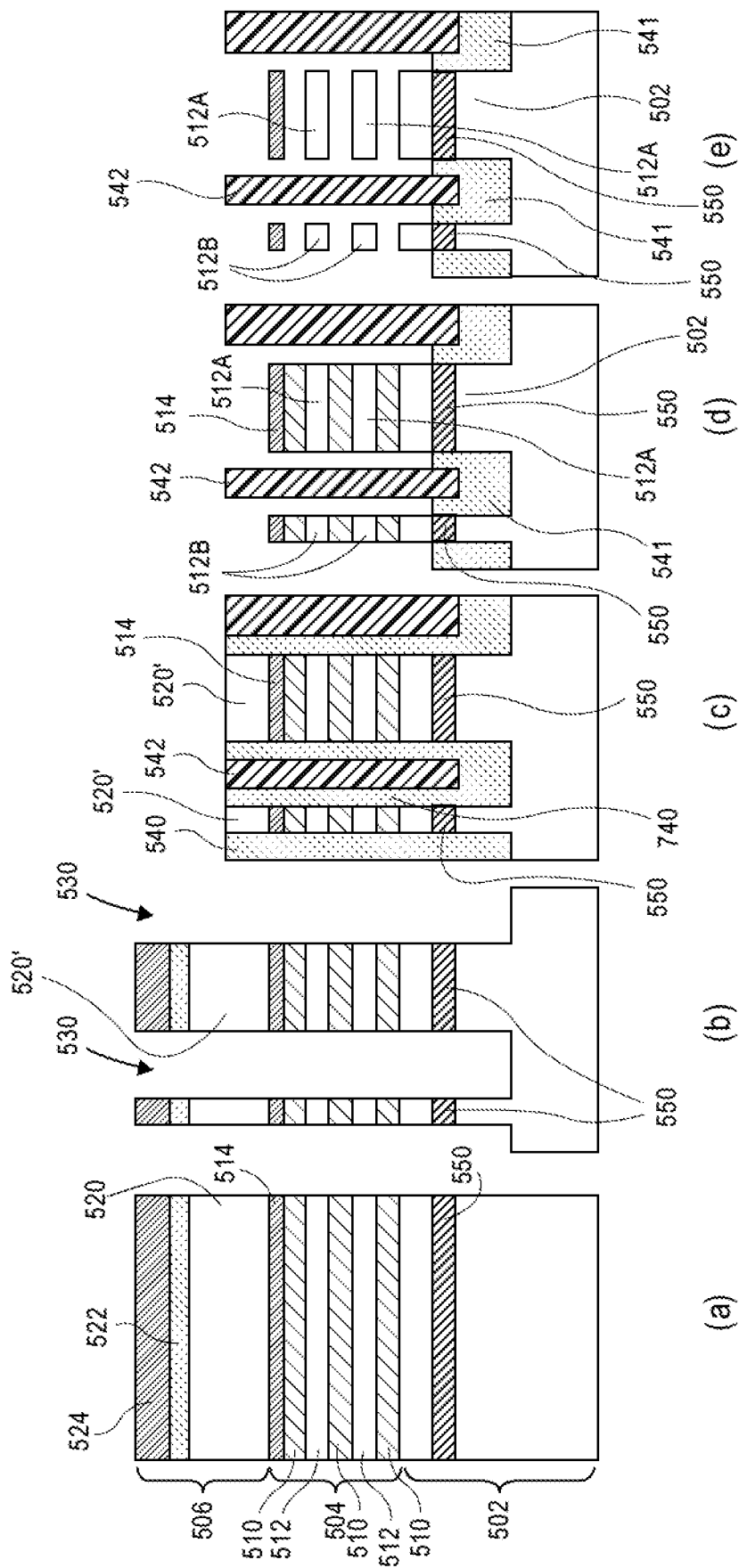
FIG. 5 illustrate cross-sectional views representing various operations in a method of fabricating a self-aligned gate endcap (SAGE) structure with gate-all-around devices, in accordance with an embodiment of the present disclosure.

In an exemplary processing scheme for structures having SAGE walls separating neighboring devices, FIG. 5 illustrate cross-sectional views representing various operations in a method of fabricating a self-aligned gate endcap (SAGE) structure with gate-all-around devices, in accordance with an embodiment of the present disclosure.

Referring to part (a) of FIG. 5, a starting structure includes a nanowire patterning stack 504 above a substrate 502. The substrate 502 includes a dopant diffusion blocking layer 550 (e.g., a carbon-containing layer), examples of which are described above in association with FIG. 1. A lithographic patterning stack 506 is formed above the nanowire stack 504. The nanowire stack 504 includes alternating silicon germanium layers 510 and silicon layers 512. A protective mask 514 is between the nanowire stack 504 and the lithographic patterning stack 506. In one embodiment, the lithographic patterning stack 506 is trilayer mask composed of a topographic masking portion 520, an anti-reflective coating (ARC) layer 522, and a photoresist layer 524. In a particular such embodiment, the topographic masking portion 520 is a carbon hardmask (CHM) layer and the anti-reflective coating layer 522 is a silicon ARC layer.

Referring to part (b) of FIG. 5, the stack of part (a) is lithographically patterned and then etched to provide an etched structure including a patterned substrate 502 and trenches 530. In an embodiment, as depicted, the dopant diffusion blocking layer 550 is patterned such that it is ultimately included in a sub-fin region.

Referring to part (c) of FIG. 5, the structure of part (b) has an isolation layer 540 and a SAGE material 542 formed in trenches 530. The structure is then planarized to leave patterned topographic masking layer 520' as an exposed upper layer.

Referring to part (d) of FIG. 5, the isolation layer 540 is recessed below an upper surface of the patterned substrate 502, e.g., to define a protruding fin portion and to provide a trench isolation structure 541 beneath SAGE walls 542.

Referring to part (e) of FIG. 5, the silicon germanium layers 510 are removed at least in the channel region to release silicon nanowires 512A and 512B. Subsequent to the formation of the structure of part (e) of FIG. 5, a gate stacks may be formed around nanowires 512B or 512A, over protruding fins of substrate 502, and between SAGE walls 542. In one embodiment, prior to formation of the gate stacks, the remaining portion of protective mask 514 is removed. In another embodiment, the remaining portion of protective mask 514 is retained as an insulating fin hat as an artifact of the processing scheme.

Referring again to part (e) of FIG. 5, it is to be appreciated that a channel view is depicted, with source or drain regions (and corresponding conductive contact structures) being locating into and out of the page. In an embodiment, the channel region including nanowires 512B has a width less than the channel region including nanowires 512A. Thus, in an embodiment, an integrated circuit structure includes multiple width (multi-Wsi) nanowires. Although structures of 512B and 512A may be differentiated as nanowires and nanoribbons, respectively, both such structures are typically referred to herein as nanowires. It is also to be appreciated that reference to or depiction of a fin/nanowire pair throughout may refer to a structure including a fin and one or more overlying nanowires (e.g., two overlying nanowires are shown in FIG. 5).

To highlight an exemplary integrated circuit structure having three vertically arranged nanowires, FIG. 6A illustrates a three-dimensional cross-sectional view of a nanowire-based integrated circuit structure, in accordance with an embodiment of the present disclosure. FIG. 6B illustrates a cross-sectional source or drain view of the nanowire-based integrated circuit structure of FIG. 6A, as taken along the a-a' axis. FIG. 6C illustrates a cross-sectional channel view of the nanowire-based integrated circuit structure of FIG. 6A, as taken along the b-b' axis.

Referring to FIG. 6A, an integrated circuit structure 600 includes one or more vertically stacked nanowires (604 set) above a substrate 602. In an embodiment, as depicted, a dopant diffusion blocking layer 650 (e.g., a carbon-containing layer) is included in in or on the substrate, examples of which are described above in association with FIG. 1. An optional fin below the bottommost nanowire and formed from the substrate 602 (and possibly including dopant diffusion blocking layer 650) is not depicted for the sake of emphasizing the nanowire portion for illustrative purposes. Embodiments herein are targeted at both single wire devices and multiple wire devices. As an example, a three nanowire-based devices having nanowires 604A, 604B and 604C is shown for illustrative purposes. For convenience of description, nanowire 604A is used as an example where description is focused on one of the nanowires. It is to be appreciated that where attributes of one nanowire are described, embodiments based on a plurality of nanowires may have the same or essentially the same attributes for each of the nanowires.

Each of the nanowires 604 includes a channel region 606 in the nanowire. The channel region 606 has a length (L). Referring to FIG. 6C, the channel region also has a perimeter (Pc) orthogonal to the length (L). Referring to both FIGS. 6A and 6C, a gate electrode stack 608 surrounds the entire perimeter (Pc) of each of the channel regions 606. The gate electrode stack 608 includes a gate electrode along with a gate dielectric layer between the channel region 606 and the gate electrode (not shown). In an embodiment, the channel region is discrete in that it is completely surrounded by the gate electrode stack 608 without any intervening material such as underlying substrate material or overlying channel fabrication materials. Accordingly, in embodiments having a plurality of nanowires 604, the channel regions 606 of the nanowires are also discrete relative to one another.

Referring to both FIGS. 6A and 6B, integrated circuit structure 600 includes a pair of non-discrete source or drain regions 610/612. The pair of non-discrete source or drain regions 610/612 is on either side of the channel regions 606 of the plurality of vertically stacked nanowires 604. Furthermore, the pair of non-discrete source or drain regions 610/612 is adjoining for the channel regions 606 of the plurality of vertically stacked nanowires 604. In one such embodiment, not depicted, the pair of non-discrete source or drain regions 610/612 is directly vertically adjoining for the channel regions 606 in that epitaxial growth is on and between nanowire portions extending beyond the channel regions 606, where nanowire ends are shown within the source or drain structures. In another embodiment, as depicted in FIG. 6A, the pair of non-discrete source or drain regions 610/612 is indirectly vertically adjoining for the channel regions 606 in that they are formed at the ends of the nanowires and not between the nanowires.

In an embodiment, as depicted, the source or drain regions 610/612 are non-discrete in that there are not individual and discrete source or drain regions for each channel region 606 of a nanowire 604. Accordingly, in embodiments having a plurality of nanowires 604, the source or drain regions 610/612 of the nanowires are global or unified source or drain regions as opposed to discrete for each nanowire. In one embodiment, from a cross-sectional perspective orthogonal to the length of the discrete channel regions 606, each of the pair of non-discrete source or drain regions 610/612 is approximately rectangular in shape with a bottom tapered portion and a top vertex portion, as depicted in FIG. 6B. In other embodiments, however, the source or drain regions 610/612 of the nanowires are relatively larger yet discrete non-vertically merged epitaxial structures such as nubs described in association with FIGS. 2F-2H.

In accordance with an embodiment of the present disclosure, and as depicted in FIGS. 6A and 6B, integrated circuit structure 600 further includes a pair of contacts 614, each contact 614 on one of the pair of non-discrete source or drain regions 610/612. In one such embodiment, in a vertical sense, each contact 614 completely surrounds the respective non-discrete source or drain region 610/612. In another aspect, the entire perimeter of the non-discrete source or drain regions 610/612 may not be accessible for contact with contacts 614, and the contact 614 thus only partially surrounds the non-discrete source or drain regions 610/612, as depicted in FIG. 6B. In a contrasting embodiment, not depicted, the entire perimeter of the non-discrete source or drain regions 610/612, as taken along the a-a' axis, is surrounded by the contacts 614.

Referring to FIGS. 6B and 6C, the non-discrete source or drain regions 610/612 are global in the sense that a single unified feature is used as a source or drain region for a plurality (in this case, 3) of nanowires 604 and, more particularly, for more than one discrete channel region 606. In an embodiment, the pair of non-discrete source or drain regions 610/612 is composed of a semiconductor material different than the semiconductor material of the discrete channel regions 606, e.g., the pair of non-discrete source or drain regions 610/612 is composed of a silicon germanium while the discrete channel regions 606 are composed of silicon. In another embodiment, the pair of non-discrete source or drain regions 610/612 is composed of a semiconductor material the same or essentially the same as the semiconductor material of the discrete channel regions 606, e.g., both the pair of non-discrete source or drain regions 610/612 and the discrete channel regions 606 are composed of silicon.

Referring again to FIG. 6A, in an embodiment, integrated circuit structure 600 further includes a pair of spacers 616. As is depicted, outer portions of the pair of spacers 616 may overlap portions of the non-discrete source or drain regions 610/612, providing for "embedded" portions of the non-discrete source or drain regions 610/612 beneath the pair of spacers 616. As is also depicted, the embedded portions of the non-discrete source or drain regions 610/612 may not extend beneath the entirety of the pair of spacers 616.

Substrate 602 may be composed of a material suitable for integrated circuit structure fabrication. In one embodiment, substrate 602 includes a lower bulk substrate composed of a single crystal of a material which may include, but is not limited to, silicon, germanium, silicon-germanium or a III-V compound semiconductor material. An upper insulator layer composed of a material which may include, but is not limited to, silicon dioxide, silicon nitride or silicon oxynitride is on the lower bulk substrate. Thus, the structure 600 may be fabricated from a starting semiconductor-on-insulator substrate. Alternatively, the structure 600 is formed directly from a bulk substrate and local oxidation is used to form electrically insulative portions in place of the above described upper insulator layer. In another alternative embodiment, the structure 600 is formed directly from a bulk substrate and doping is used to form electrically isolated active regions, such as nanowires, thereon. In one such embodiment, the first nanowire (i.e., proximate the substrate) is in the form of an omega-FET type structure.

In an embodiment, the nanowires 604 may be sized as wires or ribbons, as described below, and may have squared-off or rounder corners. In an embodiment, the nanowires 604 are composed of a material such as, but not limited to, silicon, germanium, or a combination thereof. In one such embodiment, the nanowires are single-crystalline. For example, for a silicon nanowire 604, a single-crystalline nanowire may be based from a (100) global orientation, e.g., with a <100> plane in the z-direction. As described herein, other orientations may also be considered. In an embodiment, the dimensions of the nanowires 604, from a cross-sectional perspective, are on the nano-scale. For example, in a specific embodiment, the smallest dimension of the nanowires 604 is less than approximately 20 nanometers. In an embodiment, the nanowires 604 are composed of a strained material, particularly in the channel regions 606.

Referring to FIGS. 6C, in an embodiment, each of the channel regions 606 has a width (Wc) and a height (Hc), the width (Wc) approximately the same as the height (Hc). That is, in both cases, the channel regions 606 are square-like or, if corner-rounded, circle-like in cross-section profile. In another aspect, the width and height of the channel region need not be the same, such as the case for nanoribbbons as described throughout.

In another aspect, methods of fabricating a nanowire portion of a fin/nanowire integrated circuit structure are provided. For example, FIGS. 7A-7E illustrate three-dimensional cross-sectional views representing various operations in a method of fabricating a nanowire portion of a fin/nanowire structure, in accordance with an embodiment of the present disclosure.

Figure 7A:
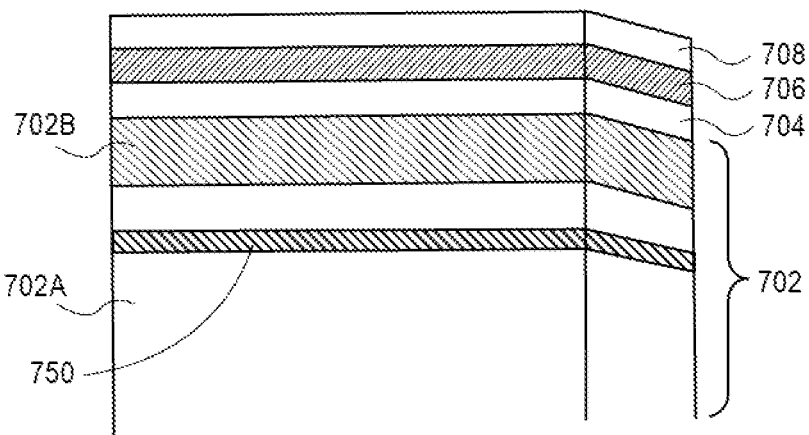
FIGS. 7A-7E illustrate three-dimensional cross-sectional views representing various operations in a method of fabricating a nanowire portion of a fin/nanowire structure, in accordance with an embodiment of the present disclosure.

A method of fabricating a nanowire integrated circuit structure may include forming a nanowire above a substrate. In a specific example showing the formation of two silicon nanowires, FIG. 7A illustrates a substrate 702 including a silicon substrate portion 702A having a dopant diffusion blocking layer 750 (e.g., a carbon-containing layer) therein or thereon, examples of which are described above in association with FIG. 1. A first sacrificial material 702B, such as a sacrificial semiconductor or insulating silicon dioxide layer, is formed above the dopant diffusion blocking layer 750. A silicon layer 704/silicon germanium layer 706/silicon layer 708 stack is above the first sacrificial material 702B. It is to be appreciated that, in another embodiment, a silicon germanium layer/silicon layer/silicon germanium layer stack may be used to ultimately form two silicon germanium nanowires.

Figure 7B:
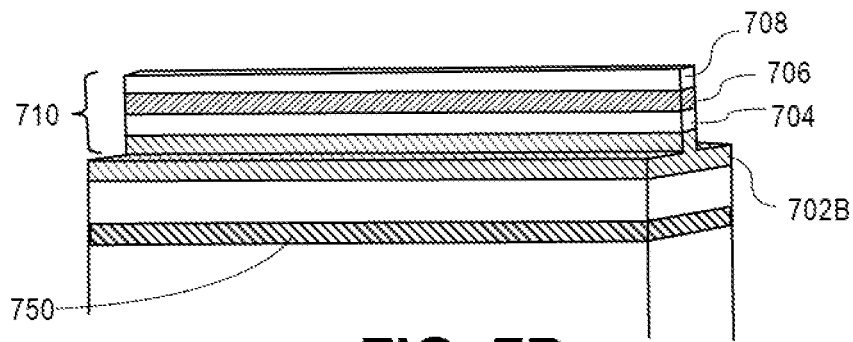

Referring to FIG. 7B, a portion of the silicon layer 704/silicon germanium layer 706/silicon layer 708 stack as well as at least a top portion of the first sacrificial material 702B is patterned into a fin-type structure 710, e.g., with a mask and plasma etch process. It is to be appreciated that, for illustrative purposes, the etch for FIG. 7B is shown as forming two silicon nanowire precursor portions. Although the etch is shown for ease of illustration as ending within a bottom isolation layer, more complex stacks are contemplated within the context of embodiments of the present disclosure. For example, the process may be applied to a nanowire/fin stack as described in association with FIG. 5.

Figure 7C:
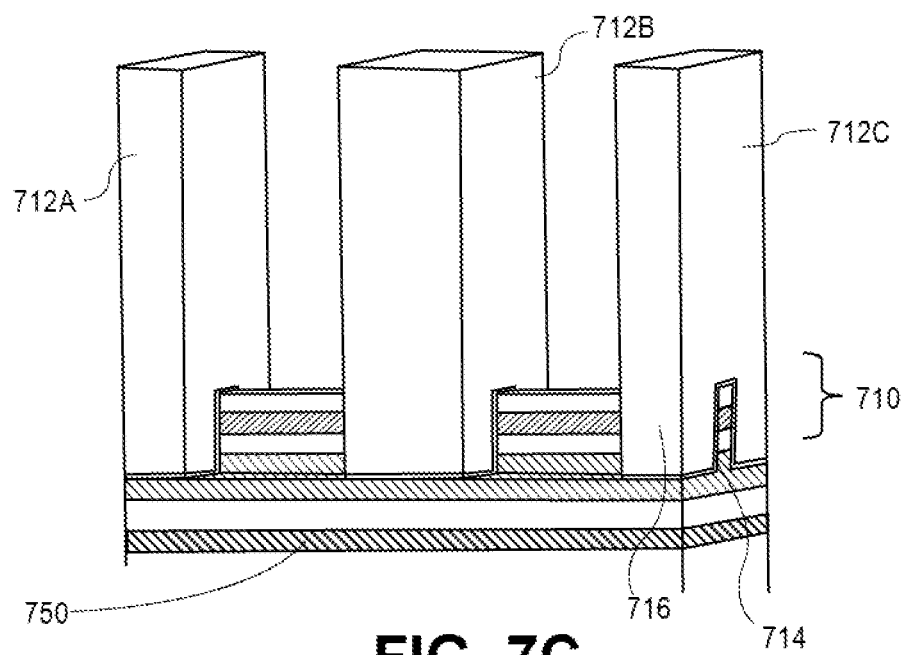

The method may also include forming a channel region in the nanowire, the channel region having a length and a perimeter orthogonal to the length. In a specific example showing the formation of three gate structures over the two silicon nanowires, FIG. 7C illustrates the fin-type structure 710 with three sacrificial gates 712A, 712B, and 712C thereon. In one such embodiment, the three sacrificial gates 712A, 712B, and 712C are composed of a sacrificial gate oxide layer 714 and a sacrificial polysilicon gate layer 716 which are blanket deposited and patterned with a plasma etch process.

Figure 7D:
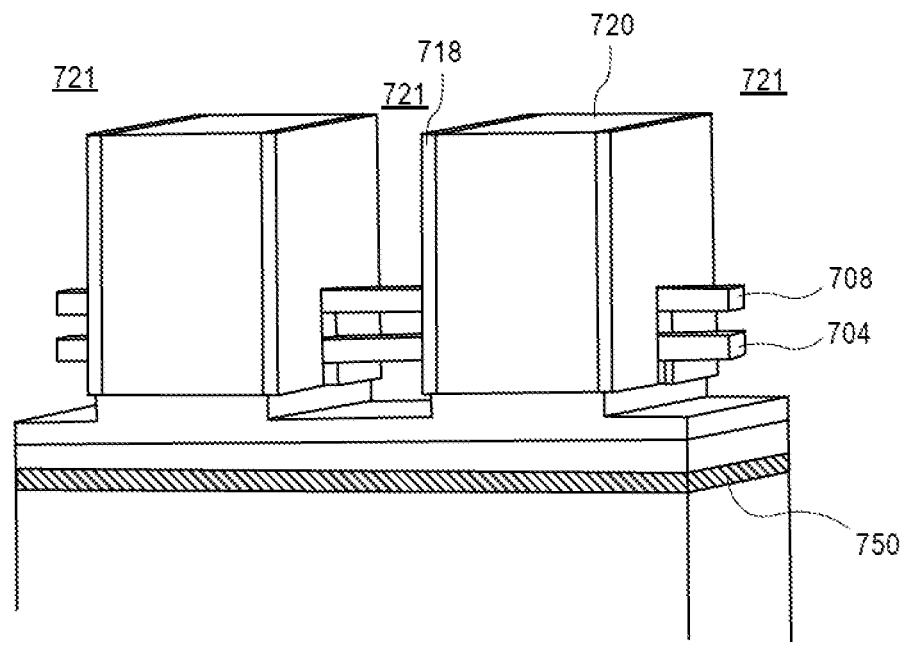

Following patterning to form the three sacrificial gates 712A, 712B, and 712C, spacers may be formed on the sidewalls of the three sacrificial gates 712A, 712B, and 712C, doping may be performed (e.g., tip and/or source and drain type doping), and an interlayer dielectric layer may be formed to cover the three sacrificial gates 712A, 712B, and 712C. The interlayer dielectric layer may be polished to expose the three sacrificial gates 712A, 712B, and 712C for a replacement gate, or gate-last, process. Referring to FIG. 7D, the three sacrificial gates 712A, 712B, and 712C have been removed, leaving spacers 718 and a portion of the interlayer dielectric layer 720 remaining.

Additionally, referring again to FIG. 7D the portions of the silicon germanium layer 706 and the portion of the insulating silicon dioxide layer 702B of the fin structure 710 are removed in the regions originally covered by the three sacrificial gates 712A, 712B, and 712C. Discrete portions of the silicon layers 704 and 708 thus remain, as depicted in FIG. 7D. Further processing may involve removal of the first sacrificial material 702B at least in the source or drain regions, enabling epitaxial source or drain growth on underlying semiconductor material. In such cases, in an embodiment, the dopant diffusion blocking layer 750 is not insulated from the resulting epitaxial source or drain structures.

The discrete portions of the silicon layers 704 and 708 shown in FIG. 7D will, in one embodiment, ultimately become channel regions in a nanowire-based device. Thus, at the process stage depicted in FIG. 7D, channel engineering or tuning may be performed. For example, in one embodiment, the discrete portions of the silicon layers 704 and 708 shown in FIG. 7D are thinned using oxidation and etch processes. Such an etch process may be performed at the same time the wires are separated by etching the silicon germanium layer 706. Accordingly, the initial wires formed from silicon layers 704 and 708 begin thicker and are thinned to a size suitable for a channel region in a nanowire device, independent from the sizing of the source and drain regions of the device. Thus, in an embodiment, forming the channel region includes removing a portion of the nanowire, and the resulting perimeters of the source and drain regions (described below) are greater than the perimeter of the resulting channel region.

Figure 7E:
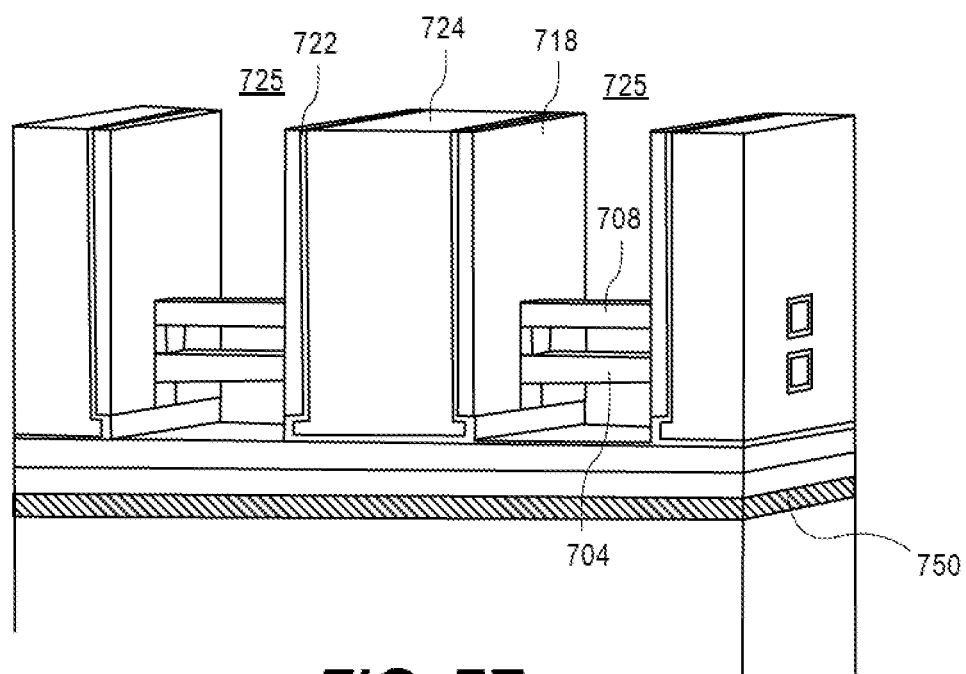

The method may also include forming a gate electrode stack surrounding the entire perimeter of the channel region. In the specific example showing the formation of three gate structures over the two silicon nanowires, FIG. 7E illustrates the structure following deposition of a gate dielectric layer 722 (such as a high-k gate dielectric layer) and a gate electrode layer 724 (such as a metal gate electrode layer), and subsequent polishing, in between the spacers 718. That is, gate structures are formed in the trenches 721 of FIG. 7D. Additionally, FIG. 7E depicts the result of the subsequent removal of the interlayer dielectric layer 720 after formation of the permanent gate stack. The portions of the silicon germanium layer 706 and the portion of the insulating silicon dioxide layer 702B of the fin structure 710 are also removed in the regions originally covered by the portion of the interlayer dielectric layer 720 depicted in FIG. 7D. Discrete portions of the silicon layers 704 and 708 thus remain, as depicted in FIG. 7E.

The method may also include forming a pair of source and drain regions in the nanowire, on either side of the channel region, each of the source and drain regions having a perimeter orthogonal to the length of the channel region. Specifically, the discrete portions of the silicon layers 704 and 708 shown in FIG. 7E will, in one embodiment, ultimately become at least a portion of the source and drain regions in a nanowire-based device. In one such embodiment, epitaxial source or drain structures are formed by merging epitaxial material around existing nanowires 704 and 708. In another embodiment, epitaxial source or drain structures are embedded, e.g., portions of nanowires 704 and 708 are removed and then source or drain (S/D) growth is performed. In the latter case, in accordance with an embodiment of the present disclosure, such epitaxial source or drain structures may be non-discrete, as exemplified in association with FIGS. 6A and 6B, or may be discrete, as exemplified in association with FIG. 2H.

The method may subsequently include forming a pair of contacts, a first of the pair of contacts completely or nearly completely surrounding the perimeter of the source region, and a second of the pair of contacts completely or nearly completely surrounding the perimeter of the drain region. In an embodiment, the contacts are formed from a metallic species. In one such embodiment, the metallic species is formed by conformally depositing a contact metal and then filling any remaining trench volume. The conformal aspect of the deposition may be performed by using chemical vapor deposition (CVD), atomic layer deposition (ALD), or metal reflow.

In an embodiment, as described throughout, an integrated circuit structure includes non-planar devices such as, but not limited to, a finFET or a tri-gate device with corresponding one or more overlying nanowire structures. In such an embodiment, a corresponding semiconducting channel region is composed of or is formed in a three-dimensional body with one or more discrete nanowire channel portions overlying the three-dimensional body. In one such embodiment, the gate structures surround at least a top surface and a pair of sidewalls of the three-dimensional body, and further surrounds each of the one or more discrete nanowire channel portions.

In an embodiment, as described throughout, a substrate may be composed of a semiconductor material that can withstand a manufacturing process and in which charge can migrate. In an embodiment, the substrate is a bulk substrate composed of a crystalline silicon, silicon/germanium or germanium layer doped with a charge carrier, such as but not limited to phosphorus, arsenic, boron or a combination thereof, to form an active region. In one embodiment, the concentration of silicon atoms in a bulk substrate is greater than 97%. In another embodiment, a bulk substrate is composed of an epitaxial layer grown atop a distinct crystalline substrate, e.g. a silicon epitaxial layer grown atop a boron-doped bulk silicon mono-crystalline substrate. A bulk substrate may alternatively be composed of a group III-V material. In an embodiment, a bulk substrate is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, a bulk substrate is composed of a III-V material and the charge-carrier dopant impurity atoms are ones such as, but not limited to, carbon, silicon, germanium, oxygen, sulfur, selenium or tellurium.

In an embodiment, as described throughout, a trench isolation layer may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, a trench isolation layer is composed of a dielectric material such as, but not limited to, silicon dioxide, silicon oxy-nitride, silicon nitride, or carbon-doped silicon nitride.

In an embodiment, as described throughout, self-aligned gate endcap isolation structures may be composed of a material or materials suitable to ultimately electrically isolate, or contribute to the isolation of, portions of permanent gate structures from one another. Exemplary materials or material combinations include a single material structure such as silicon dioxide, silicon oxy-nitride, silicon nitride, or carbon-doped silicon nitride. Other exemplary materials or material combinations include a multi-layer stack having lower portion silicon dioxide, silicon oxy-nitride, silicon nitride, or carbon-doped silicon nitride and an upper portion higher dielectric constant material such as hafnium oxide.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 8:
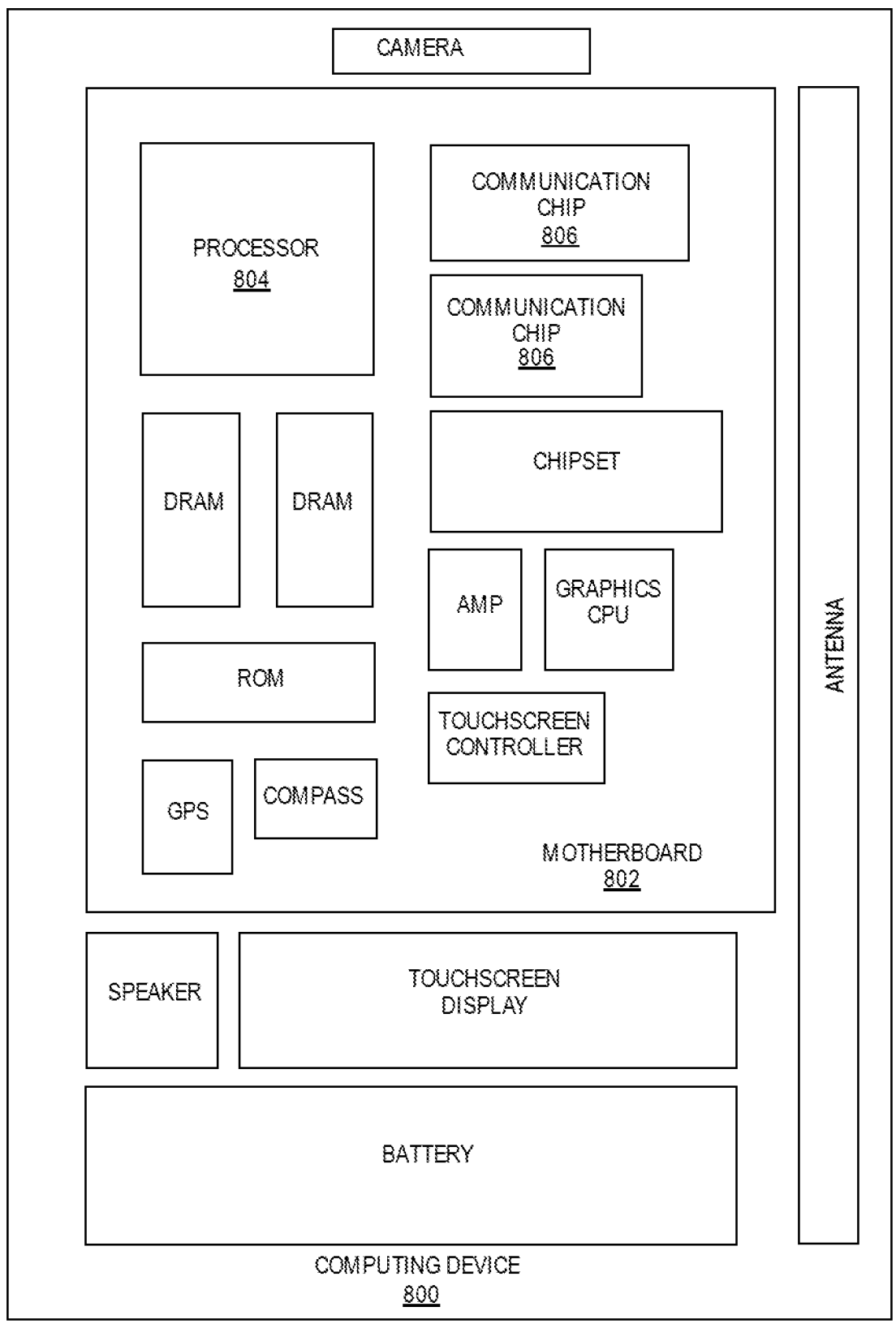
FIG. 8 illustrates a computing device in accordance with one implementation of an embodiment of the disclosure.

FIG. 8 illustrates a computing device 800 in accordance with one implementation of an embodiment of the present disclosure. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. The integrated circuit die of the processor 804 may include one or more structures, such as gate-all-around integrated circuit structures built in accordance with implementations of embodiments of the present disclosure. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. The integrated circuit die of the communication chip 806 may include one or more structures, such as gate-all-around integrated circuit structures built in accordance with implementations of embodiments of the present disclosure.

In further implementations, another component housed within the computing device 800 may contain an integrated circuit die that includes one or structures, such as gate-all-around integrated circuit structures built in accordance with implementations of embodiments of the present disclosure.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Figure 9:
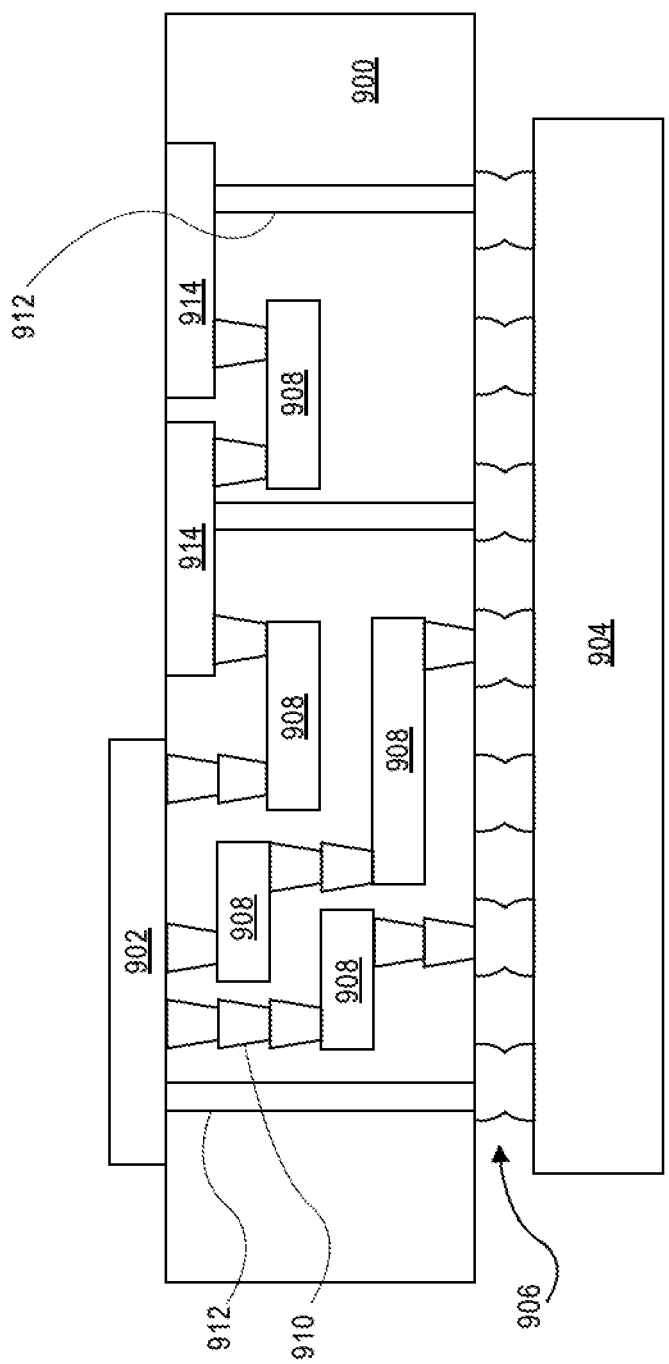
FIG. 9 illustrates an interposer that includes one or more embodiments of the disclosure.

FIG. 9 illustrates an interposer 900 that includes one or more embodiments of the present disclosure. The interposer 900 is an intervening substrate used to bridge a first substrate 902 to a second substrate 904. The first substrate 902 may be, for instance, an integrated circuit die. The second substrate 904 may be, for instance, a memory module, a computer motherboard, or another integrated circuit die. Generally, the purpose of an interposer 900 is to spread a connection to a wider pitch or to reroute a connection to a different connection. For example, an interposer 900 may couple an integrated circuit die to a ball grid array (BGA) 906 that can subsequently be coupled to the second substrate 904. In some embodiments, the first and second substrates 902/904 are attached to opposing sides of the interposer 900. In other embodiments, the first and second substrates 902/904 are attached to the same side of the interposer 900. And in further embodiments, three or more substrates are interconnected by way of the interposer 900.

The interposer 900 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 908 and vias 910, including but not limited to through-silicon vias (TSVs) 912. The interposer 900 may further include embedded devices 914, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 900. In accordance with embodiments of the disclosure, apparatuses or processes disclosed herein may be used in the fabrication of interposer 900 or in the fabrication of components included in the interposer 900.

In another aspect, semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. Furthermore, the demand for higher performance devices results in a need for an improved semiconductor package that enables a thin packaging profile and low overall warpage compatible with subsequent assembly processing.

In an embodiment, wire bonding to a ceramic or organic package substrate is used. In another embodiment, a C4 process is used to mount a die to a ceramic or organic package substrate. In particular, C4 solder ball connections can be implemented to provide flip chip interconnections between semiconductor devices and substrates. A flip chip or Controlled Collapse Chip Connection (C4) is a type of mounting used for semiconductor devices, such as integrated circuit (IC) chips, MEMS or components, which utilizes solder bumps instead of wire bonds. The solder bumps are deposited on the C4 pads, located on the top side of the substrate package. In order to mount the semiconductor device to the substrate, it is flipped over with the active side facing down on the mounting area. The solder bumps are used to connect the semiconductor device directly to the substrate.

Figure 10:
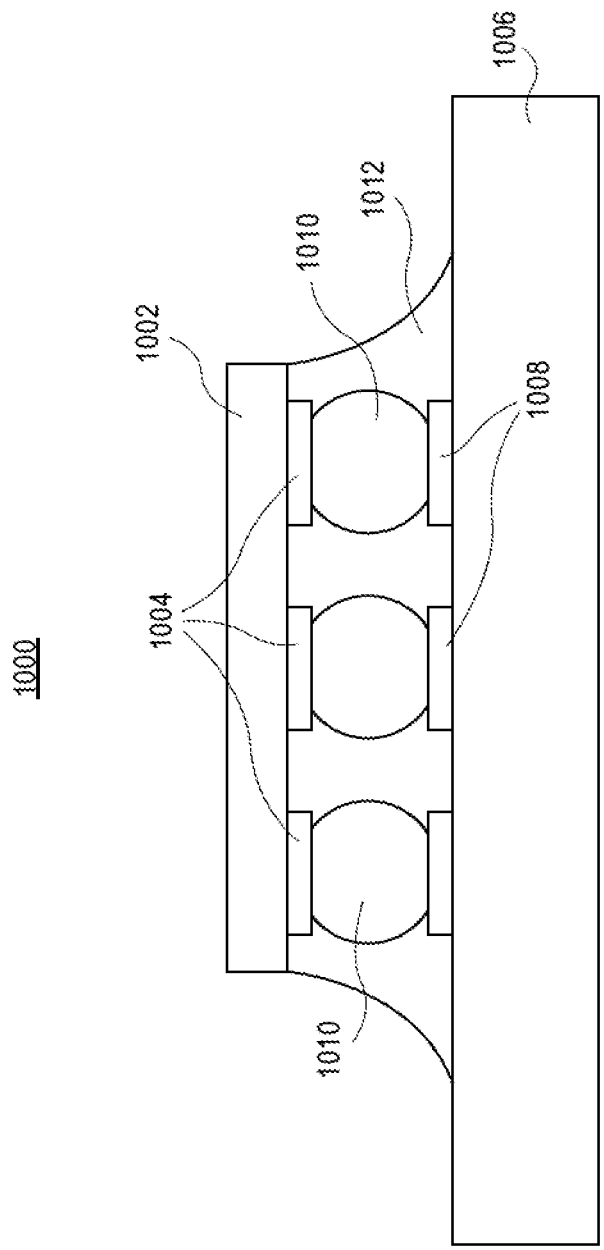
FIG. 10 illustrates a cross-sectional view of a flip-chip mounted die, in accordance with an embodiment of the present disclosure.

FIG. 10 illustrates a cross-sectional view of a flip-chip mounted die, in accordance with an embodiment of the present disclosure.

Referring to FIG. 10, an apparatus 1000 includes a die 1002 such as an integrated circuit (IC) fabricated according to one or more processes described herein or including one or more features described herein, in accordance with an embodiment of the present disclosure. The die 1002 includes metallized pads 1004 thereon. A package substrate 1006, such as a ceramic or organic substrate, includes connections 1008 thereon. The die 1002 and package substrate 1006 are electrically connected by solder balls 1010 coupled to the metallized pads 1004 and the connections 1008. An underfill material 1012 surrounds the solder balls 1010.

Processing a flip chip may be similar to conventional IC fabrication, with a few additional operations. Near the end of the manufacturing process, the attachment pads are metalized to make them more receptive to solder. This typically consists of several treatments. A small dot of solder is then deposited on each metalized pad. The chips are then cut out of the wafer as normal. To attach the flip chip into a circuit, the chip is inverted to bring the solder dots down onto connectors on the underlying electronics or circuit board. The solder is then re-melted to produce an electrical connection, typically using an ultrasonic or alternatively reflow solder process. This also leaves a small space between the chip's circuitry and the underlying mounting. In most cases an electrically-insulating adhesive is then "underfilled" to provide a stronger mechanical connection, provide a heat bridge, and to ensure the solder joints are not stressed due to differential heating of the chip and the rest of the system.

In other embodiments, newer packaging and die-to-die interconnect approaches, such as through silicon via (TSV) and silicon interposer, are implemented to fabricate high performance Multi-Chip Module (MCM) and System in Package (SiP) incorporating an integrated circuit (IC) fabricated according to one or more processes described herein or including one or more features described herein, in accordance with an embodiment of the present disclosure.

Thus, embodiments of the present disclosure include gate-all-around integrated circuit structures having underlying dopant-diffusion blocking layers, and methods of fabricating gate-all-around integrated circuit structures with underlying dopant-diffusion blocking layers.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure includes a vertical arrangement of horizontal nanowires above a fin. The fin includes a dopant diffusion blocking layer on a first semiconductor layer, and a second semiconductor layer on the dopant diffusion blocking layer. A gate stack is around the vertical arrangement of horizontal nanowires. A first epitaxial source or drain structure is at a first end of the vertical arrangement of horizontal nanowires. A second epitaxial source or drain structure is at a second end of the vertical arrangement of horizontal nanowires.

Example embodiment 2: The integrated circuit structure of example 1, wherein the fin includes a portion of a bulk silicon substrate, and wherein the first semiconductor layer is a region within the portion of the bulk silicon substrate.

Example embodiment 3: The integrated circuit structure of example 1 or 2, wherein the first and second epitaxial source or drain structures are on the second semiconductor layer.

Example embodiment 4: The integrated circuit structure of example 1 or 2, wherein the first and second epitaxial source or drain structures are on a recessed portion of the second semiconductor layer.

Example embodiment 5: The integrated circuit structure of example 1 or 2, wherein the first and second epitaxial source or drain structures are on a portion of the dopant diffusion blocking layer.

Example embodiment 6: The integrated circuit structure of example 1, 2, 3, 4 or 5, wherein the dopant diffusion blocking layer comprises carbon and silicon.

Example embodiment 7: The integrated circuit structure of example 6, wherein the dopant diffusion blocking layer further comprises germanium.

Example embodiment 8: The integrated circuit structure of example 1, 2, 3, 4, 5, 6 or 7, wherein the first and second epitaxial source or drain structures are non-discrete first and second epitaxial source or drain structures.

Example embodiment 9: The integrated circuit structure of example 1, 2, 3, 4, 5, 6 or 7, wherein the first and second epitaxial source or drain structures are discrete first and second epitaxial source or drain structures.

Example embodiment 10: The integrated circuit structure of example 1, 2, 3, 4, 5, 6, 7, 8 or 9, wherein the vertical arrangement of horizontal nanowires is a vertical arrangement of silicon nanowires, a vertical arrangement of silicon germanium nanowires, a vertical arrangement of germanium nanowires, or a vertical arrangement of Group III-V material nanowires.

Example embodiment 11: The integrated circuit structure of example 1, 2, 3, 4, 5, 6, 7, 8, 9 or 10, wherein the gate stack comprises a high-k gate dielectric layer and a metal gate electrode.

Example embodiment 12: An integrated circuit structure includes a vertical arrangement of horizontal nanowires above a fin. The fin includes a carbon-containing layer on an N-type semiconductor layer, and a semiconductor layer on the carbon-containing layer. A gate stack is around the vertical arrangement of horizontal nanowires. A first P-type epitaxial source or drain structure is at a first end of the vertical arrangement of horizontal nanowires. A second P-type epitaxial source or drain structure is at a second end of the vertical arrangement of horizontal nanowires.

Example embodiment 13: The integrated circuit structure of example 12, wherein the fin includes a portion of a bulk silicon substrate, and the N-type semiconductor layer is a region within the portion of the bulk silicon substrate.

Example embodiment 14: The integrated circuit structure of example 12 or 13, wherein the first and second P-type epitaxial source or drain structures are on the semiconductor layer.

Example embodiment 15: The integrated circuit structure of example 12 or 13, wherein the first and second P-type epitaxial source or drain structures are on a recessed portion of the semiconductor layer.

Example embodiment 16: The integrated circuit structure of example 12 or 13, wherein the first and second P-type epitaxial source or drain structures are on a portion of the carbon-containing layer.

Example embodiment 17: The integrated circuit structure of example 12, 13, 14, 15 or 16, wherein the carbon-containing layer further includes silicon, germanium, or both silicon and germanium.

Example embodiment 18: The integrated circuit structure of example 12, 13, 14, 15, 16 or 17, wherein the first and second P-type epitaxial source or drain structures are non-discrete first and second epitaxial source or drain structures.

Example embodiment 19: An integrated circuit structure includes a vertical arrangement of horizontal nanowires above a fin. The fin includes a carbon-containing layer on a P-type semiconductor layer, and a semiconductor layer on the carbon-containing layer. A gate stack is around the vertical arrangement of horizontal nanowires. A first N-type epitaxial source or drain structure is at a first end of the vertical arrangement of horizontal nanowires. A second N-type epitaxial source or drain structure is at a second end of the vertical arrangement of horizontal nanowires.

Example embodiment 20: The integrated circuit structure of example 19, wherein the fin includes a portion of a bulk silicon substrate, and the P-type semiconductor layer is a region within the portion of the bulk silicon substrate.

Example embodiment 21: The integrated circuit structure of example 19 or 20, wherein the first and second N-type epitaxial source or drain structures are on the semiconductor layer.

Example embodiment 22: The integrated circuit structure of example 19 or 20, wherein the first and second N-type epitaxial source or drain structures are on a recessed portion of the semiconductor layer.

Example embodiment 23: The integrated circuit structure of example 19 or 20, wherein the first and second N-type epitaxial source or drain structures are on a portion of the carbon-containing layer.

Example embodiment 24: The integrated circuit structure of example 19, 20, 21, 22 or 23, wherein the carbon-containing layer further includes silicon, germanium, or both silicon and germanium.

Example embodiment 25: The integrated circuit structure of example 19, 20, 21, 22, 23 or 24, wherein the first and second N-type epitaxial source or drain structures are non-discrete first and second epitaxial source or drain structures.

What is claimed is:

1. An integrated circuit structure, comprising:
   a nanowire above a fin, the fin comprising a layer comprising carbon and silicon;
   a gate stack around the nanowire, wherein a portion of the gate stack is vertically between the nanowire and the layer comprising carbon and silicon;
   a first epitaxial source or drain structure at a first end of the nanowire, the first epitaxial source or drain structure having a bottommost surface above a bottommost surface of the layer comprising carbon and silicon; and
   a second epitaxial source or drain structure at a second end of the nanowire, the second epitaxial source or drain structure having a bottommost surface above the bottommost surface of the layer comprising carbon and silicon.

2. The integrated circuit structure of claim 1, wherein the fin comprises a portion of a bulk silicon substrate.

3. The integrated circuit structure of claim 1, wherein the first and second epitaxial source or drain structures are on a portion of the layer comprising carbon and silicon.

4. The integrated circuit structure of claim 1, wherein the layer comprising carbon and silicon further comprises germanium.

5. The integrated circuit structure of claim 1, wherein the layer comprising carbon and silicon further comprises germanium.

6. The integrated circuit structure of claim 1, further comprising:
   a second nanowire above the nanowire.

7. The integrated circuit structure of claim 1, wherein the first and second epitaxial source or drain structures are non-discrete first and second epitaxial source or drain structures.

8. The integrated circuit structure of claim 1, wherein the first and second epitaxial source or drain structures are discrete first and second epitaxial source or drain structures.

9. The integrated circuit structure of claim 1, wherein the nanowire is a silicon nanowire.

10. The integrated circuit structure of claim 1, wherein the nanowire is a silicon germanium nanowire.

11. The integrated circuit structure of claim 1, wherein the nanowire is a germanium nanowire.

12. The integrated circuit structure of claim 1, wherein the nanowire is a Group III-V material nanowire.

13. The integrated circuit structure of claim 1, wherein the gate stack comprises a high-k gate dielectric layer and a metal gate electrode.

14. The integrated circuit structure of claim 1, wherein the layer comprising carbon and silicon is a dopant-diffusion blocking layer.

15. A computing device, comprising:
    a board; and
    a component coupled to the board, the component including an integrated circuit structure, comprising:
        a nanowire above a fin, the fin comprising a layer comprising carbon and silicon;
        a gate stack around the nanowire, wherein a portion of the gate stack is vertically between the nanowire and the layer comprising carbon and silicon;
        a first epitaxial source or drain structure at a first end of the nanowire, the first epitaxial source or drain structure having a bottommost surface above a bottommost surface of the layer comprising carbon and silicon; and
        a second epitaxial source or drain structure at a second end of the nanowire, the second epitaxial source or drain structure having a bottommost surface above a bottommost surface of the layer comprising carbon and silicon.

16. The computing device of claim 15, further comprising:
    a memory coupled to the board.

17. The computing device of claim 15, further comprising:
    a communication chip coupled to the board.

18. The computing device of claim 15, further comprising:
    a battery coupled to the board.

19. The computing device of claim 15, wherein the component is a packaged integrated circuit die.

20. The computing device of claim 15, wherein the component is selected from the group consisting of a processor, a communications chip, and a digital signal processor.

* * * * *